United States Patent
Peng et al.

(10) Patent No.: US 10,503,863 B2
(45) Date of Patent: Dec. 10, 2019

(54) INTEGRATED CIRCUIT AND METHOD OF MANUFACTURING SAME

(71) Applicant: TAIWAN SEMICONDUCTOR MANUFACTURING COMPANY, LTD., Hsinchu (TW)

(72) Inventors: Shih-Wei Peng, Hsinchu (TW); Chih-Liang Chen, Hsinchu (TW); Charles Chew-Yuen Young, Cupertino, CA (US); Hui-Zhong Zhuang, Kaohsiung (TW); Jiann-Tyng Tzeng, Hsinchu (TW); Shun Li Chen, Tainan (TW); Wei-Cheng Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/966,693

(22) Filed: Apr. 30, 2018

(65) Prior Publication Data
US 2019/0065658 A1 Feb. 28, 2019

Related U.S. Application Data

(60) Provisional application No. 62/552,220, filed on Aug. 30, 2017.

(51) Int. Cl.
*G06F 17/50* (2006.01)
*H01L 27/02* (2006.01)
*H01L 27/118* (2006.01)

(52) U.S. Cl.
CPC ...... *G06F 17/5081* (2013.01); *G06F 17/5068* (2013.01); *G06F 17/5077* (2013.01);
(Continued)

(58) Field of Classification Search
CPC ............ G06F 17/5081; G06F 17/5068; G06F 17/5077; H01L 27/11807; H01L 27/0207; H01L 2027/11875
See application file for complete search history.

(56) References Cited

U.S. PATENT DOCUMENTS 8,881,083 B1 * 11/2014 Deng .................. G06F 17/5077
716/119
9,595,536 B1 * 3/2017 Haigh ............... H01L 27/11807

FOREIGN PATENT DOCUMENTS

TW 201349451 12/2013
TW 201729133 8/2017
(Continued)

OTHER PUBLICATIONS

Notice of Allowance dated Jan. 31, 2019 from corresponding application No. TW 107125561.

*Primary Examiner* — Naum Levin
(74) *Attorney, Agent, or Firm* — Hauptman Ham, LLP

(57) ABSTRACT

A method of forming an integrated circuit includes generating, by a processor, a layout design of the integrated circuit based on a set of design rules and manufacturing the integrated circuit based on the layout design. The integrated circuit has a first gate. Generating the layout design includes generating a set of gate layout patterns, generating a cut feature layout pattern and generating a first via layout pattern. The cut feature layout pattern extends in a first direction, is located on the first layout level and overlaps at least a first gate layout pattern. The set of gate layout patterns extends in a second direction and is located on a first layout level. The first via layout pattern is over the first gate layout pattern, and is separated in the second direction from the cut feature layout pattern by a first distance. The first distance satisfies a first design rule.

20 Claims, 16 Drawing Sheets

(52) U.S. Cl.
CPC .... *H01L 27/0207* (2013.01); *H01L 27/11807* (2013.01); *H01L 2027/11875* (2013.01)

(56) References Cited

FOREIGN PATENT DOCUMENTS

| | | |
|---|---|---|
| TW | 201812624 | 4/2018 |
| TW | 201813037 | 4/2018 |

\* cited by examiner

US 10,503,863 B2

INTEGRATED CIRCUIT AND METHOD OF MANUFACTURING SAME

PRIORITY CLAIM

This application claims the benefit of U.S. Provisional Application No. 62/552,220, filed Aug. 30, 2017, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

The patent or application file contains drawings/photographs executed in color. Copies of this patent with color drawing(s)/photograph(s) will be provided by the Office upon request and payment of the necessary fee.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
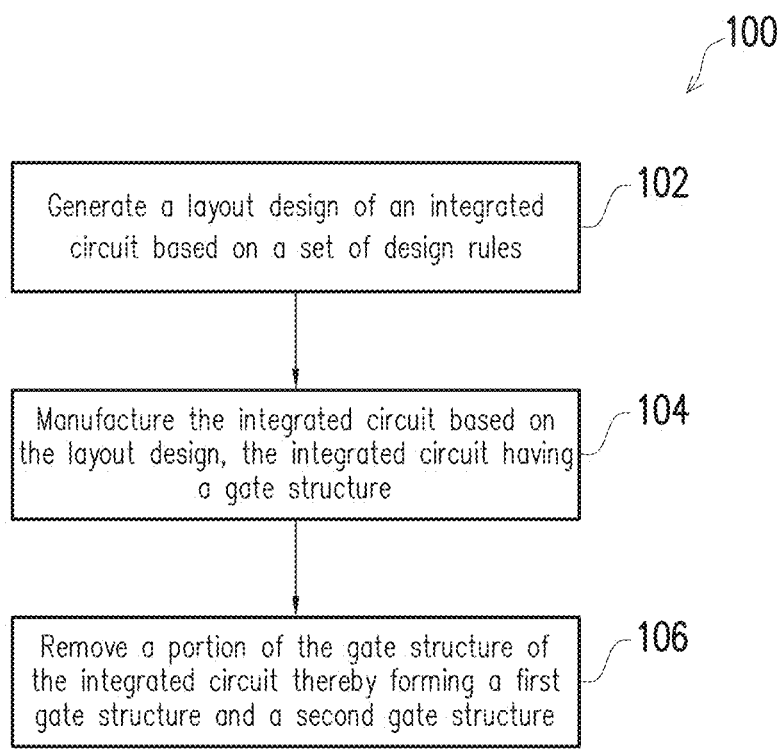
FIG. 1 is a flowchart of a method of manufacturing an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming an integrated circuit includes generating, by a processor, a layout design of the integrated circuit based on a set of design rules and manufacturing the integrated circuit based on the layout design. The integrated circuit has a first gate. Generating the layout design includes generating a set of gate layout patterns, generating a cut feature layout pattern and generating a first via layout pattern. The cut feature layout pattern extends in a first direction, is located on a first layout level and overlaps at least a first gate layout pattern. The set of gate layout patterns extends in a second direction and is located on the first layout level. The first via layout pattern is over the first gate layout pattern, and is separated in the second direction from the cut feature layout pattern by a first distance. The first distance satisfies a first design rule.

In some embodiments, by satisfying one or more design rules, layout design and corresponding integrated circuits manufactured by the layout designs account for process limitations resulting in integrated circuits capable of being manufactured with a higher yield compared to other approaches. In some embodiments, by satisfying one or more design rules, layout design and corresponding integrated circuits manufactured by the layout designs are smaller compared to other approaches. In some embodiments, by satisfying one or more design rules, layout design and corresponding integrated circuits manufactured by the layout designs have higher gate density compared to other approaches. In some embodiments, by using one or more layout designs of the present application, the integrated circuit manufactured by the corresponding one or more layout designs has a gate density that is at least 10% greater compared to other approaches.

In some embodiments, the set of design rules includes spacing requirements between each of the vias in the layout design. In some embodiments, the set of design rules includes pitch spacing requirements between via layout patterns.

In some embodiments, the set of design rules includes pitch spacing requirements between fin layout patterns of layout designs. In some embodiments, the set of design rules includes spacing requirements between via layout patterns and cut feature layout patterns. In some embodiments, the set of design rules includes spacing requirements between active region layout patterns and cut feature layout patterns.

In some embodiments, the set of design rules includes spacing requirements between active region layout patterns. In some embodiments, the set of design rules includes one or more metal over diffusion (MD) design rules. In some embodiments, the set of design rules includes one or more via over gate (VG) landing design rules. In some embodiments, the set of design rules includes one or more metal zero (M0) metal track design rules.

Figure 3A:
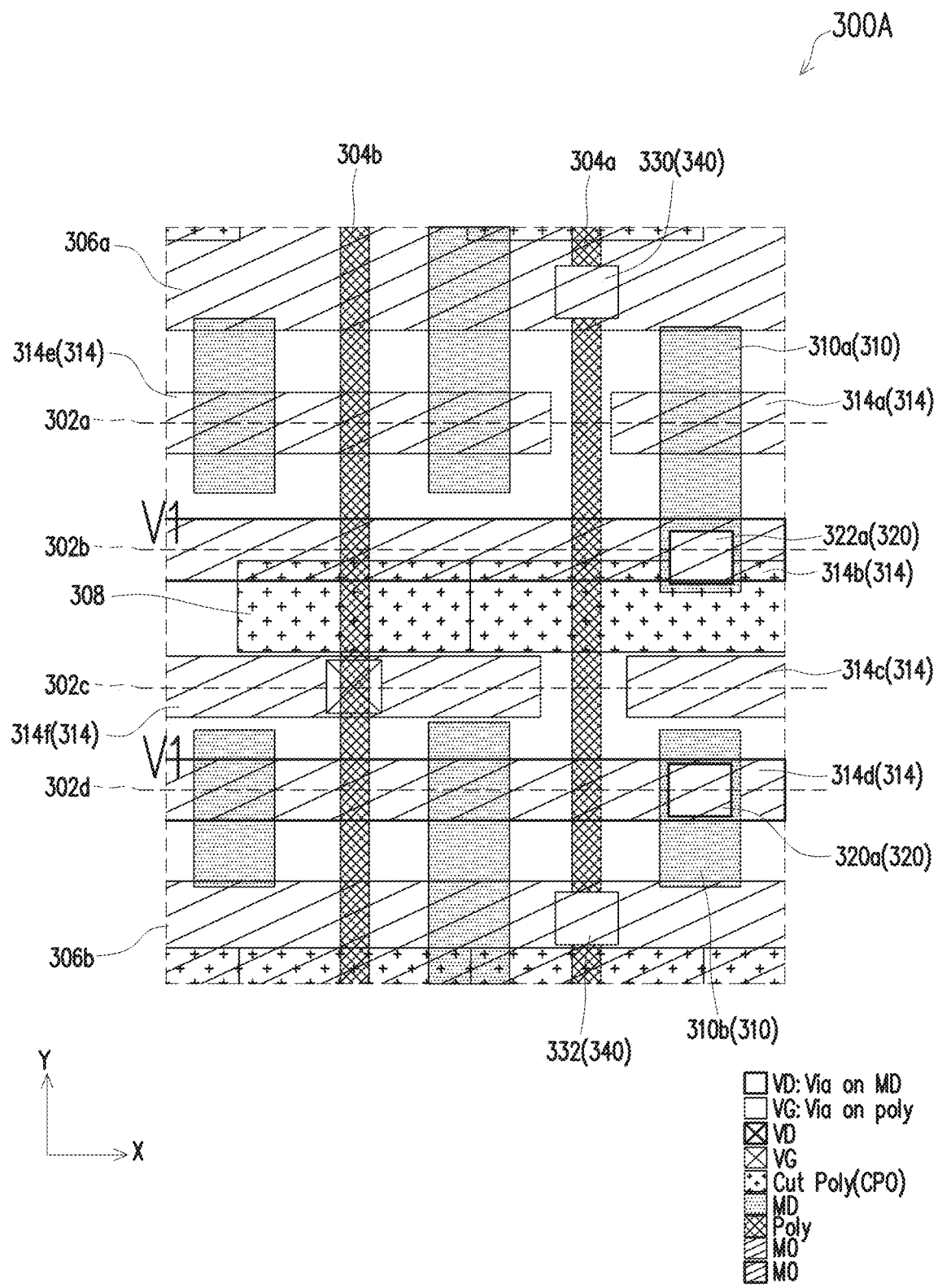
FIG. 3A is a diagram of a layout design of an integrated circuit, in accordance with some embodiments.
Figure 3B:
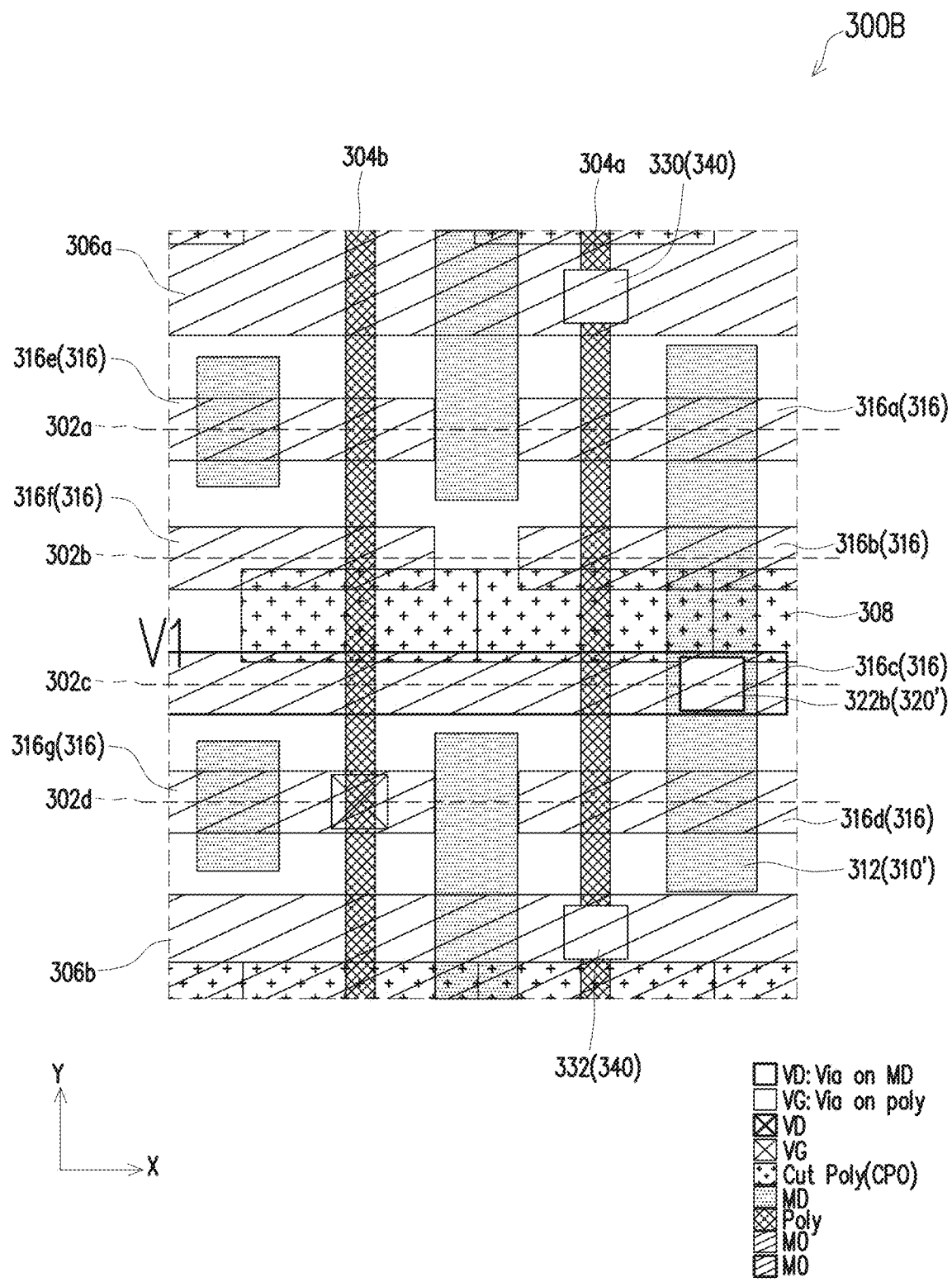
FIG. 3B is a diagram of a layout design of an integrated circuit, in accordance with some embodiments.
Figures 4A, 4B:
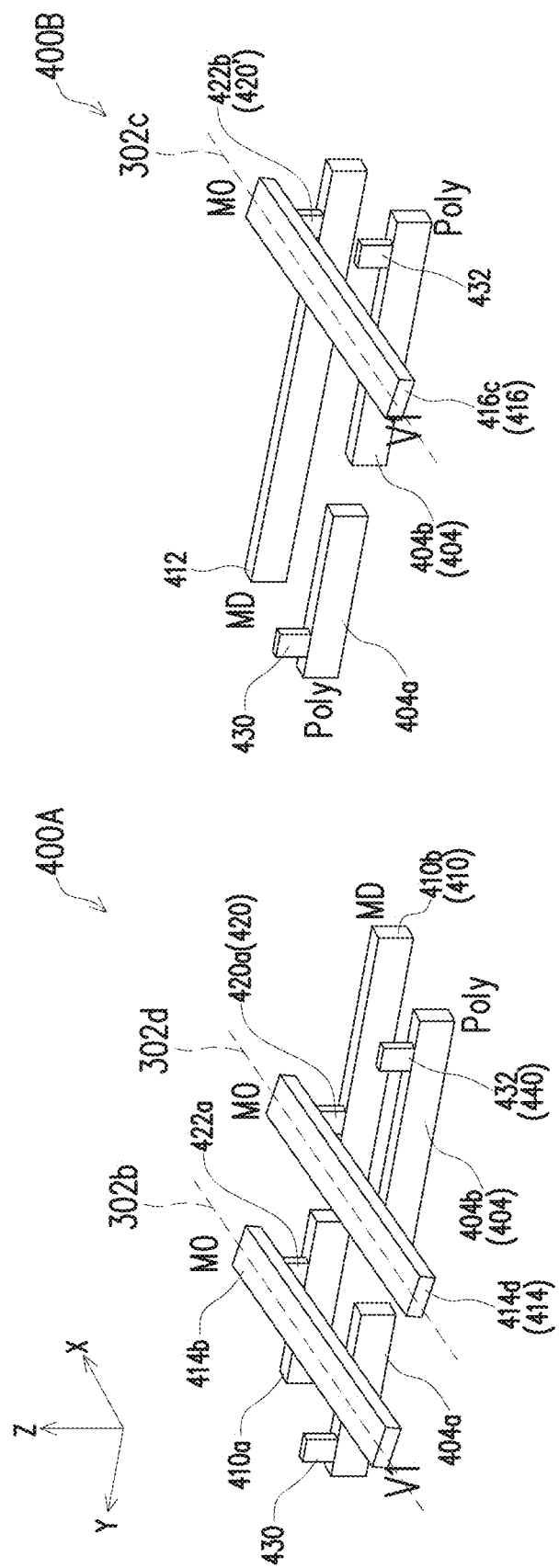
FIG. 4A is a perspective diagram of an integrated circuit, in accordance with some embodiments.
FIG. 4B is a perspective diagram of an integrated circuit, in accordance with some embodiments.

FIG. 1 is a flowchart of a method 100 of manufacturing an integrated circuit in accordance with some embodiments. It is understood that additional operations may be performed before, during, and/or after the method 100 depicted in FIG. 1, and that some other processes may only be briefly described herein. In some embodiments, the method 100 is usable to form integrated circuits, such as integrated circuit 400A (FIG. 4A) or integrated circuit 400B (FIG. 4B). In some embodiments, the method 100 is usable to form integrated circuits having similar structural relationships as one or more of layout designs 300A-300B, 500A-500B or 600-900 (FIGS. 3A-3B, 5A-5B or 6-9).

In operation 102 of method 100, a layout design of an integrated circuit is generated based on a set of design rules. In some embodiments, the layout design of method 100 includes one or more layout designs, such as one or more of layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9) of an integrated circuit, such as integrated circuit 400A (FIG. 4A) or integrated circuit 400B (FIG. 4B).

Figure 8:
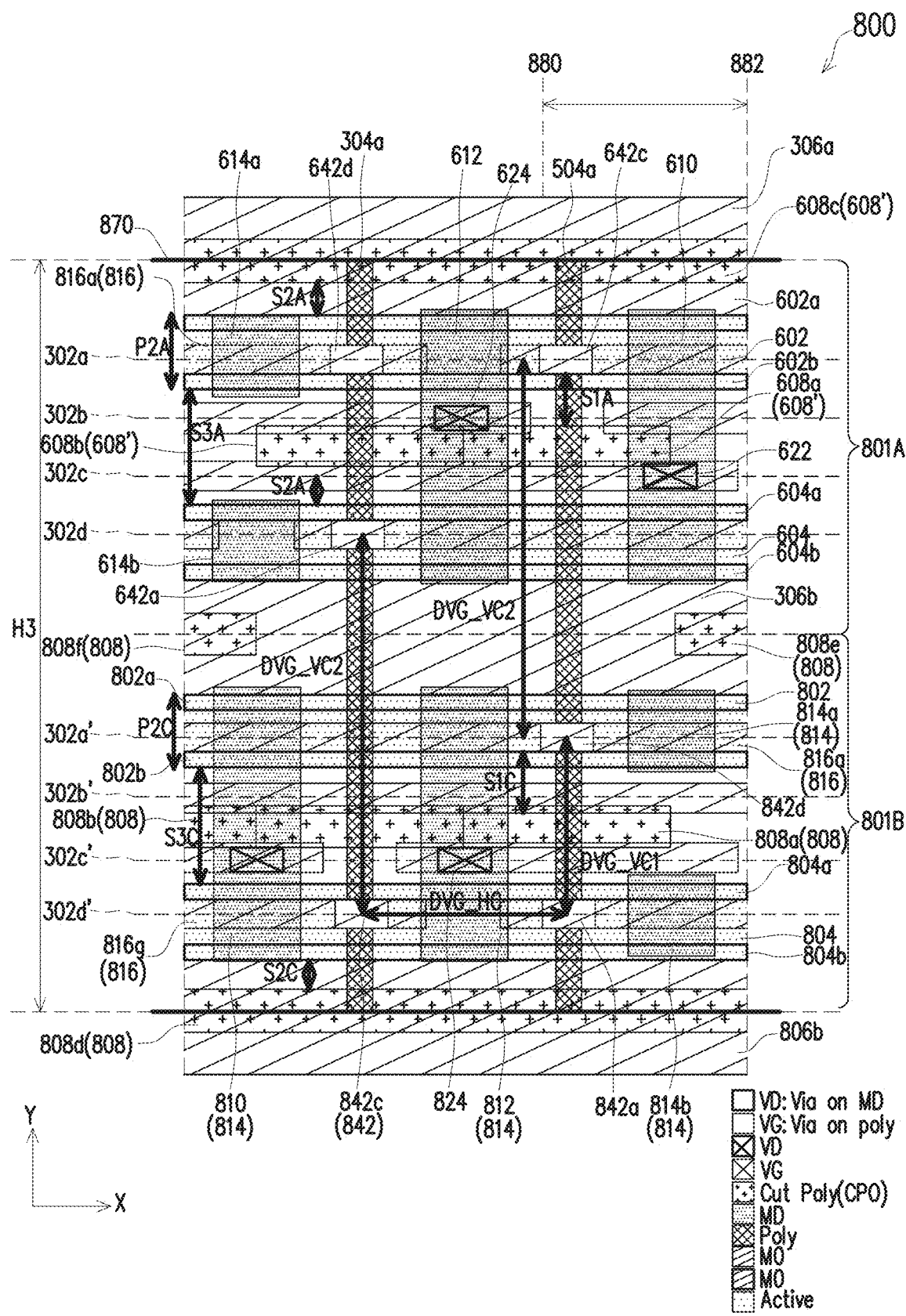
FIG. 8 is a diagram of a layout design of an integrated circuit, in accordance with some embodiments.
Figure 9:
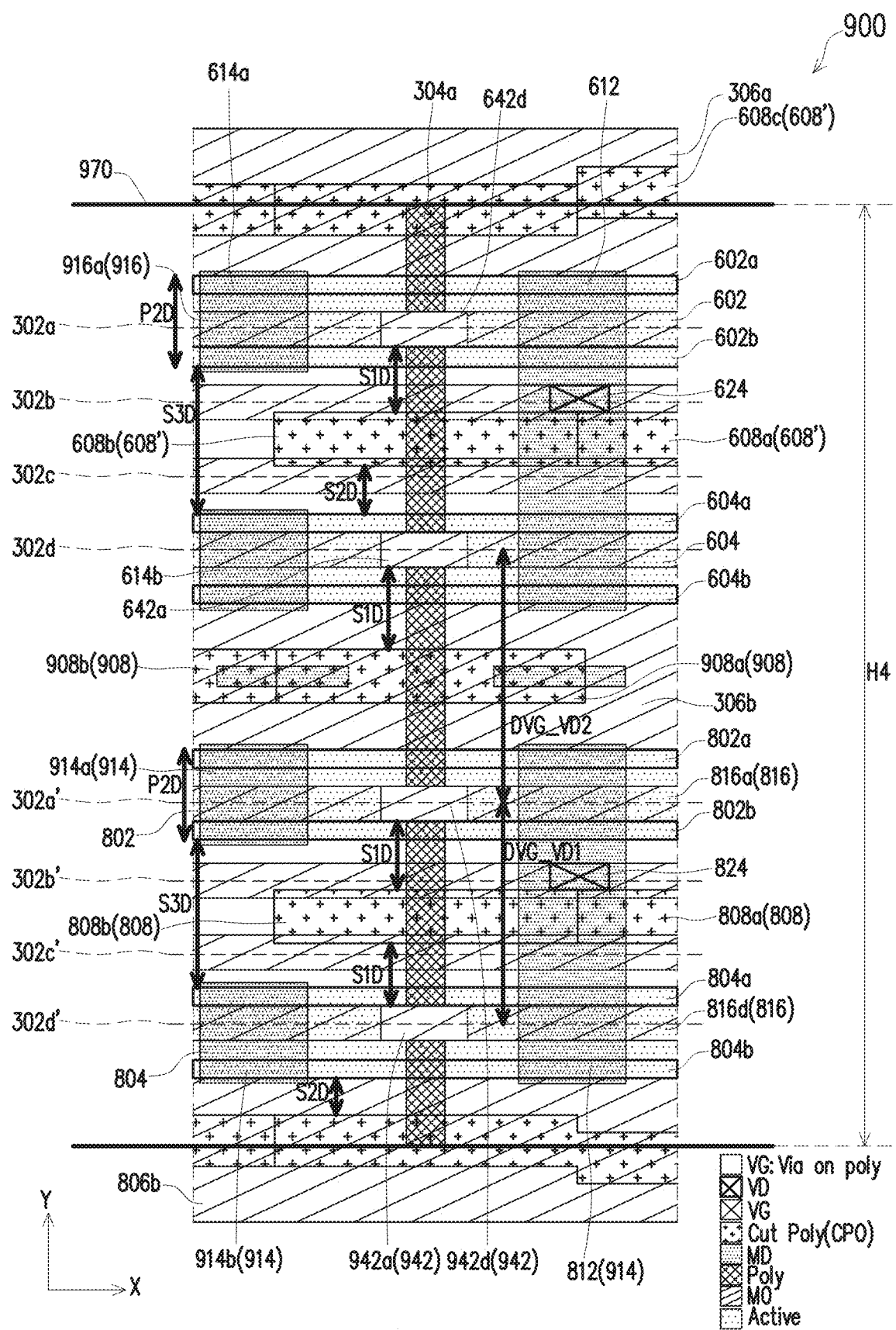
FIG. 9 is a diagram of a layout design of an integrated circuit, in accordance with some embodiments.

In some embodiments, operation 102 of method 100 is performed by a processing device (e.g., processor 1102 (FIG. 11)) configured to execute instructions for generating a layout design, such as layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9). In some embodiments, one or more of layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9) is a graphic database system (GDSII) file format. In some embodiments, operation 102 of method 100 is utilized to generate one or more of layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9).

In some embodiments, the set of design rules of method 100 or method 200 (FIG. 2) includes one or more design rules of layout design 300A-300B (FIGS. 3A-3B), layout design 500A-500B (FIGS. 5A-5B) or layout design 600-900 (FIGS. 6-9). In some embodiments, the set of design rules of method 100 or method 200 (FIG. 2) includes one or more design rules of formulas 1-21 (described in FIGS. 6-9), VG landing design rules of layout design 500A-500B (FIGS. 5A-5B), M0 metal track design rules of layout design 500A-500B (FIGS. 5A-5B) or MD design rules of layout design 300A-300B (FIGS. 3A-3B).

Method 100 continues with operation 104, where the integrated circuit (e.g., integrated circuit 400A-400B (FIGS. 4A-4B) is manufactured based on one or more of layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9).

In some embodiments, operation 104 comprises manufacturing at least one mask based on one or more of layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9), and manufacturing the integrated circuit (e.g., integrated circuit 400A-400B (FIGS. 4A-4B) based on the at least one mask. In some embodiments, operation 104 of method 100 is utilized to manufacture integrated circuit (e.g., integrated circuit 400A-400B (FIGS. 4A-4B) based on one or more of layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9).

Method 100 continues with operation 106, where a portion of a gate (e.g., gate 404a, 404b) is removed thereby forming a first gate structure (e.g., gate 404a or 404b) and a second gate structure (e.g., the other of gate 404a or 404b) of integrated circuit 400A-400B.

In some embodiments, the portion of the gate (e.g., gate 404a, 404b) that is removed in operation 106 is identified in one or more of layout designs 300A-300B, 500A-500B or 600-900 (FIGS. 3A-3B, 5A-5B or 6-9) by one or more cut feature layout patterns 308a, 308b, 608a, 608b, 608c, 608d, 708a, 708b, 808a, 808b, 808e, 808f, 908a or 908b of the set of cut feature layout patterns 308, 608, 708, 808 or 908. In some embodiments, operation 106 of method 100 is referred to as a cut-poly (CPO) process. In some embodiments, operation 106 results in the formation of integrated circuit 400A-400B (FIGS. 4A-4B). In some embodiments, the removed gate portion of gate 404a and gate 404b is referred to as a cut region.

In some embodiments, operation 106 is performed by a removal process. In some embodiments, the removal process includes one or more etching processes suitable to remove a portion of the gate (e.g., gate 404a, 404b). In some embodiments, the etching process of operation 106 includes identifying a portion of the gate (e.g., gate 404a, 404b) that is to be removed, and etching the portion of the gate (e.g., gate 404a, 404b) that is to be removed. In some embodiments, a mask is used to specify portions of the gate (e.g., gate 404a, 404b) that are to be cut or removed. In some embodiments, the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

In some embodiments, one or more of operations 102, 104 or 106 is not performed.

Figure 2:
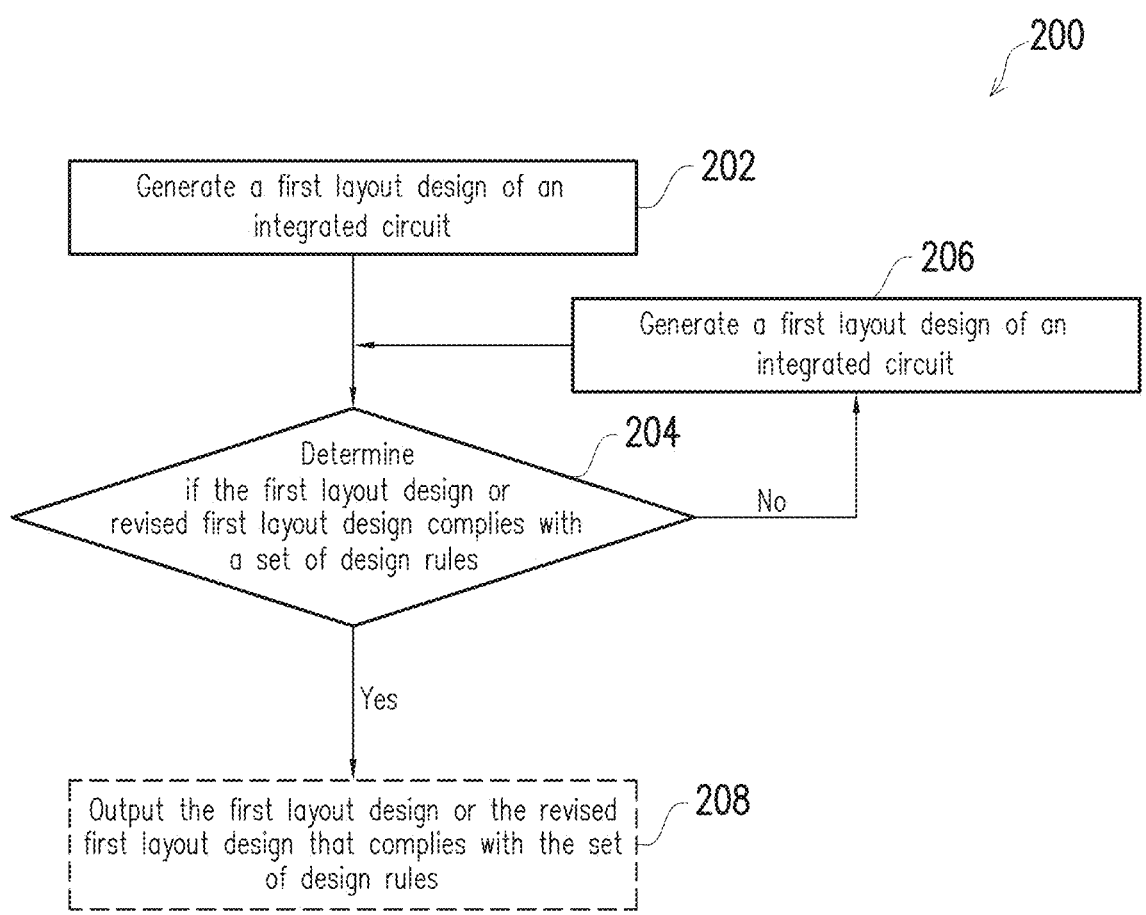
FIG. 2 is a flowchart of a method of generating a layout design of an integrated circuit based on a set of design rules, in accordance with some embodiments.

FIG. 2 is a flowchart of a method 200 of generating a layout design of an integrated circuit based on a set of design rules in accordance with some embodiments.

It is understood that additional operations may be performed before, during, and/or after the method 200 depicted in FIG. 2, and that some other processes may only be briefly described herein. In some embodiments, the method 200 is usable to generate one or more layout designs, such as layout design 300A, 300B, 500A, 500B or 600-900 (FIGS. 3A-3B, 5A-5B or 6-9) of an integrated circuit, such as integrated circuit 400A (FIG. 4A) or integrated circuit 400B (FIG. 4B) based on a set of design rules (FIGS. 3A-3B, 5A-5B & 6-9). Method 200 is an embodiment of operation 102 of method 100 (FIG. 1).

In operation 202 of method 200, a first layout design (e.g., layout design 300A of FIG. 3A or layout design 500A of FIG. 5A) of an integrated circuit, such as integrated circuit 400A or 400B (FIGS. 4A-4B), is generated. In some embodiments, the first layout design of method 200 includes one or more layout designs, such as layout design 300B, 500B or 600-900 (FIGS. 3A-3B, 5A-5B or 6-9).

In operation 204 of method 200, a determination is made whether the first layout design (e.g., layout design 300A of FIG. 3A or layout design 500A of FIG. 5A) or a revised first layout design (e.g., layout design 300B of FIG. 3B or layout design 500B of FIG. 5B) complies with a set of design rules (FIGS. 3A-3B, 5A-5B and 6-9). In some embodiments, the revised first layout design (e.g., layout design 300B of FIG. 3B or layout design 500B of FIG. 5B) is generated in operation 206.

In some embodiments, the set of design rules includes spacing requirements between each of the vias in the layout design (e.g., layout design 300A-300B, 500A-500B or 600-900 (FIGS. 3A-3B, 5A-5B or 6-9)). For example, if the vias in the layout design (e.g., layout design 300A-300B, 500A-500B or 600-900 (FIGS. 3A-3B, 5A-5B or 6-9)) are not sufficiently separated from each other, the vias cannot be consistently manufactured due to shorted out vias.

In some embodiments, the set of design rules includes pitch spacing requirements (e.g., one or more of poly pitch P1A, P1B, P1C or P1D or distance DVG_HA, DVG_VA, DVG_HB, DVG_VB, DVG_VC, DVG_VC1, DVG_VC2, DVG_VD1, DVG_VD2 in FIGS. 6-9) between via layout patterns of layout designs 300A-300B, 500A-500B or 600-900 (FIGS. 3A-3B, 5A-5B or 6-9).

In some embodiments, the set of design rules includes pitch spacing requirements (e.g., pitch P2A, P2B, P2C or P2D in FIGS. 6-9) between fin layout patterns of layout designs 300A-300B, 500A-500B or 600-900 (FIGS. 3A-3B, 5A-5B or 6-9).

In some embodiments, the set of design rules includes spacing requirements (e.g., distance S1A, S1B, S1C or S1D in FIGS. 6-9) between via layout patterns and cut feature layout patterns of layout designs 300A-300B, 500A-500B or 600-900 (FIGS. 3A-3B, 5A-5B or 6-9).

In some embodiments, the set of design rules includes spacing requirements (e.g., distance S2A, S2B, S2C or S2D in FIGS. 6-9) between active region layout patterns and cut feature layout patterns of layout designs 300A-300B, 500A-500B or 600-900 (FIGS. 3A-3B, 5A-5B or 6-9).

In some embodiments, the set of design rules includes spacing requirements (e.g., distance S3A, S3B, S3C or S3D in FIGS. 6-9) between active region layout patterns of layout designs 300A-300B, 500A-500B or 600-900 (FIGS. 3A-3B, 5A-5B or 6-9). In some embodiments, one or more active region layout patterns of layout designs 300A-300B, 500A-500B or 600-900 (FIGS. 3A-3B, 5A-5B or 6-9) define corresponding active regions in an integrated circuit manufactured by layout designs 300A-300B, 500A-500B or 600-900 (FIGS. 3A-3B, 5A-5B or 6-9). In some embodiments, one or more active regions correspond to source and/or drain diffusion portions of at least one transistor having a first dopant type. In some embodiments, the first dopant type is a p-dopant type. In some embodiments, the first dopant type is an n-dopant type.

Figure 5A:
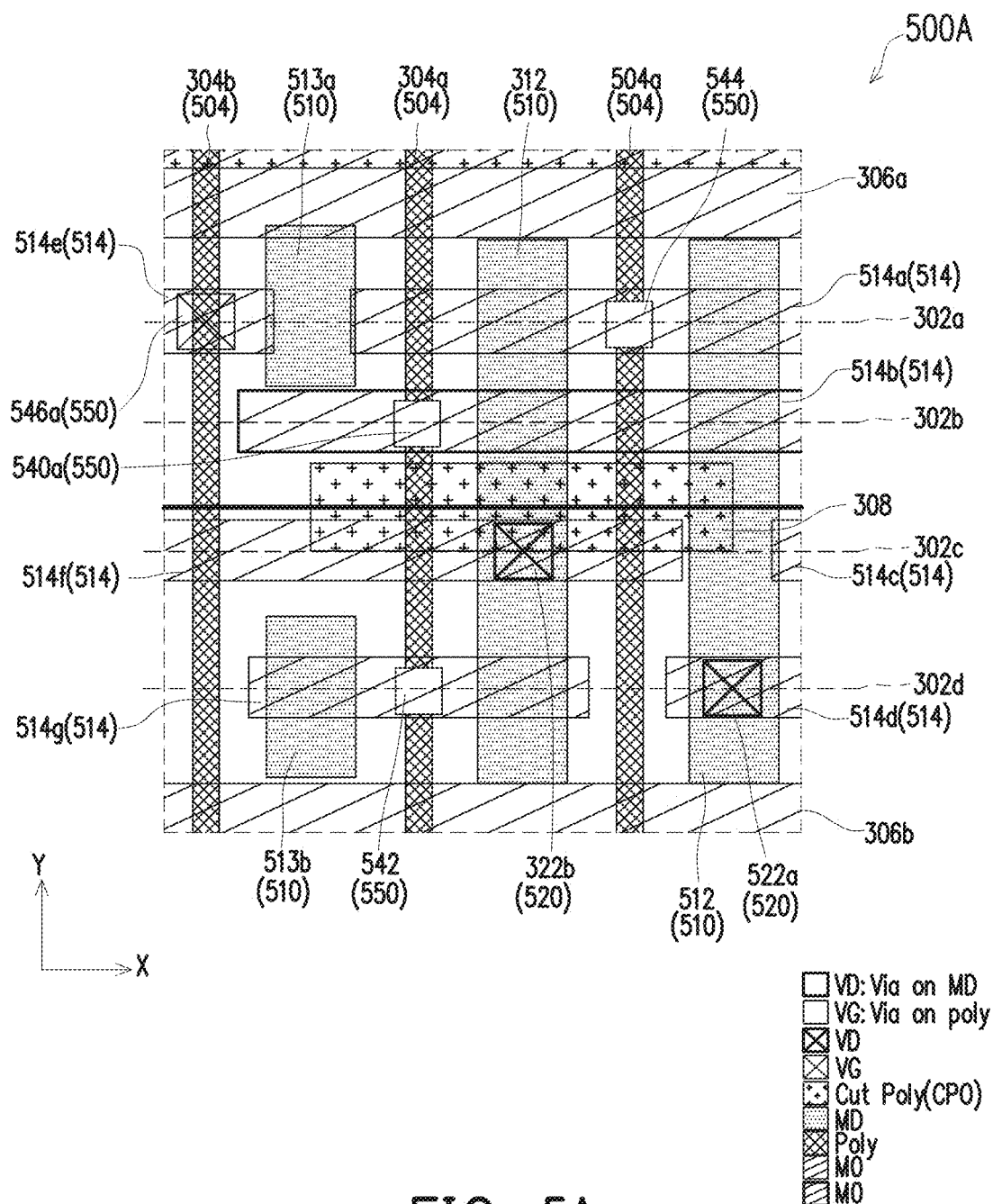
FIG. 5A is a diagram of a layout design of an integrated circuit, in accordance with some embodiments.
Figure 5B:
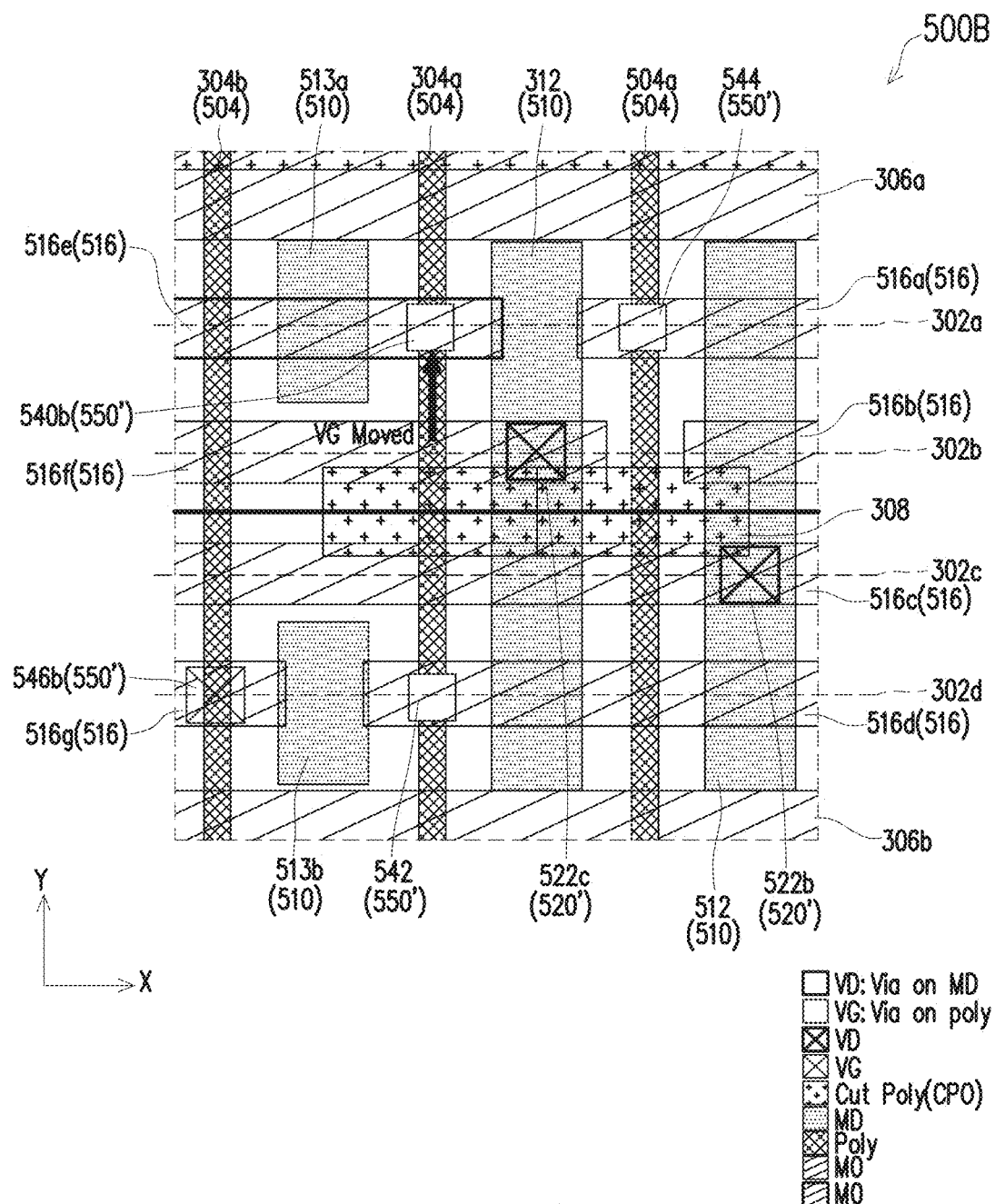
FIG. 5B is a diagram of a layout design of an integrated circuit, in accordance with some embodiments.

In some embodiments, the set of design rules includes one or more design rules of formulas 1-21 of layout design 600-900 (FIGS. 6-9). In some embodiments, the set of design rules includes one or more MD design rules of layout design 300A-300B (FIGS. 3A-3B). In some embodiments, the set of design rules includes one or more VG landing design rules of layout design 500A-500B (FIGS. 5A-5B). In some embodiments, the set of design rules includes one or more M0 metal track design rules of layout design 500A-500B (FIGS. 5A-5B).

In some embodiments, the set of design rules depends upon the number of masks or colors used in the layout design (e.g., layout design 300A-300B, 500A-500B, 600-900 of FIGS. 3A-3B, 5A-5B or 6-9).

In some embodiments, one or more of the set of design rules of layout design (e.g., layout design 300A-300B, 500A-500B, 600-900 of FIGS. 3A-3B, 5A-5B or 6-9) are implemented in method 100 or 200 in conjunction with other design rules of layout design (e.g., layout design 300A-300B, 500A-500B, 600-900 of FIGS. 3A-3B, 5A-5B or 6-9). In some embodiments, one or more of the set of design rules of layout design (e.g., layout design 300A-300B, 500A-500B, 600-900 of FIGS. 3A-3B, 5A-5B or 6-9) are implemented in method 100 or 200 separately from other design rules of layout design (e.g., layout design 300A-300B, 500A-500B, 600-900 of FIGS. 3A-3B, 5A-5B or 6-9). In some embodiments, the set of design rules of method 100 or 200 are specified by a user interface (e.g., user interface 1118 (FIG. 11)).

In some embodiments, determining if the first layout design (e.g., layout design 300A of FIG. 3A or layout design 500A of FIG. 5A) or the revised first layout design (e.g., layout design 300B of FIG. 3B or layout design 500B of FIG. 5B) complies with the set of design rules of operation 204 comprises performing a design rule check of the first layout design (e.g., layout design 300A of FIG. 3A or layout design 500A of FIG. 5A) or the revised first layout design (e.g., layout design 300B of FIG. 3B or layout design 500B of FIG. 5B) based on the set of design rules.

If the first layout design (e.g., layout design 300A of FIG. 3A or layout design 500A of FIG. 5A) or the revised first layout design (e.g., layout design 300B of FIG. 3B or layout design 500B of FIG. 5B) is determined to have complied with the set of design rules, then method 200 proceeds to operation 208. If the first layout design (e.g., layout design 300A of FIG. 3A or layout design 500A of FIG. 5A) or the revised first layout design (e.g., layout design 300B of FIG. 3B or layout design 500B of FIG. 5B) is determined to not have complied with the set of design rules, then method 200 proceeds to operation 206.

In operation 206 of method 200, the first layout design (e.g., layout design 300A of FIG. 3A or layout design 500A of FIG. 5A) is revised based on the set of design rules. In some embodiments, the revised first layout design includes one or more of layout design 300B of FIG. 3B or layout design 500B of FIG. 5B.

In some embodiments, operation 206 comprises generating a revised first layout design (e.g., layout design 300B of FIG. 3B or layout design 500B of FIG. 5B) based on the first layout design (e.g., layout design 300A of FIG. 3A or layout design 500A of FIG. 5A) and the set of design rules. In some embodiments, revising the first layout design during operation 206 comprises generating a second layout design based on the set of design rules, the second layout design corresponding to the revised first layout design (e.g., layout design 300B of FIG. 3B or layout design 500B of FIG. 5B).

Figure 11:
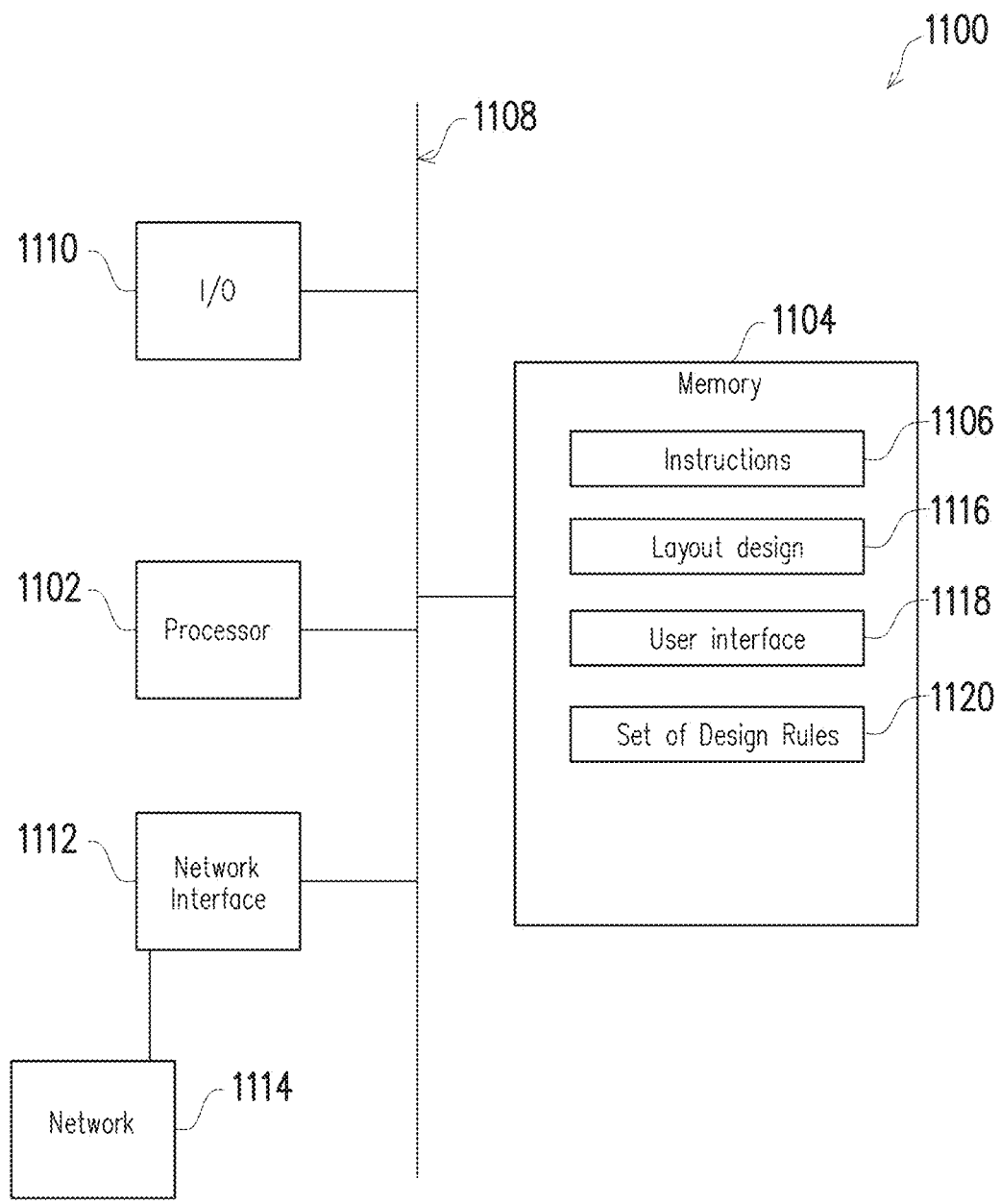
FIG. 11 is a block diagram of a system for designing an IC layout design, in accordance with some embodiments.

In operation 208 of method 200, the first layout design or the revised layout design (e.g., layout design 300B of FIG. 3B or layout design 500B of FIG. 5B) is output by system 1100 (FIG. 11). In some embodiments, the first layout design or the revised layout design (e.g., layout design 300B, 500B or 600-900 (FIGS. 3A-3B, 5A-5B or 6-9) of operation 208 complies with the set of design rules. In some embodiments, one or more of operations 206 or 208 is not performed. In in some embodiments, operation 208 generates a second layout design. In some embodiments, the second layout design of operation 208 corresponds to the first layout design or the revised first layout design.

For example, in some embodiments, if layout design 300a of FIG. 3A or layout design 500A of FIG. 5A corresponds to the first layout design of method 200, and operation 204 determines that layout design 300A of FIG. 3A or layout design 500A of FIG. 5A does not comply with the set of design rules, then layout design 300A of FIG. 3A or layout design 500A of FIG. 5A, is not output as the first layout design after execution of operation 208.

In some embodiments, the first layout design of method 200 includes one or more of layout designs 600-900 (FIGS. 6-9), each of which comply with the set of design rules. In these embodiments, in operation 208, one or more of layout designs 600-900 (FIGS. 6-9) is output as the first layout design that complies with the set of design rules. In some embodiments, operation 208 comprises outputting the second layout design, the second layout design complying with the set of design rules.

In some embodiments, the first layout design or the revised first layout design of method 200 includes one or more of layout designs 300A, 300B, 500A, 500B or 600-900 (FIGS. 3A-3B, 5A-5B or 6-9). In some embodiments, one or more operations of 202-208 of method 200 is performed by a processing device (e.g., processor 1102 (FIG. 11)) configured to execute instructions for generating one or more of layout design 300A, 300B, 500A, 500B or 600-900 (FIGS. 3A-3B, 5A-5B or 6-9).

FIG. 3A is a diagram of a layout design 300A of an integrated circuit, in accordance with some embodiments.

Layout design 300A is usable to manufacture an integrated circuit similar to integrated circuit 400A of FIG. 4A. Components that are the same or similar to those in each of FIGS. 3A-3B, 5A-5B or 6-9 are given the same reference numbers, and similar detailed description thereof is thus omitted. In some embodiments, layout design 300A corresponds to the first layout design of an integrated circuit after operation 202 in method 200 (FIG. 2).

Layout design 300A includes one or more gate layout patterns 304a, 304b (collectively referred to as a "set of gate layout patterns 304") being located on a first layout level of layout design 300A. In some embodiments, the first layout level of one or more of layout designs 300A-300B, 500A-500B or 600-900 (FIGS. 3A-3B, 5A-5B or 6-9) corresponds to the poly layout level. Each of the layout patterns 304a, 304b of the set of gate layout patterns 304 is separated from an adjacent layout pattern of the set of gate layout patterns 304 in a first direction X by a poly pitch (not labeled). The set of gate layout patterns extends in a second direction Y different from the first direction X. In some embodiments, the first direction X is perpendicular to the second direction Y. The set of gate layout patterns 304 is usable to manufacture a corresponding set of gates 404 of an integrated circuit 400A-400B (FIGS. 4A-4B). Other configurations or quantities of layout patterns in the set of gate layout patterns 304 are within the scope of the present disclosure.

Layout design 300A further includes one or more power rail layout patterns 306a, 306b (collectively referred to as a "set of power rail layout patterns 306") extending in the first direction X, and being located on a second layout level different from the first layout level. In some embodiments, the second layout level corresponds to the metal zero (M0) layer of one or more of layout designs 300A-300B, 500A-500B or 600-900 (FIGS. 3A-3B, 5A-5B or 6-9). In some embodiments, the second layout level is above the first layout level. In some embodiments, the second layout level is below the first layout level. The set of power rail layout patterns 306 is usable to manufacture a corresponding set of power rails (not shown) of an integrated circuit, such as integrated circuit 400A-400B (FIGS. 4A-4B). In some embodiments, the set of power rails (not shown) are configured to provide a first supply voltage VDD or second supply voltage VSS to the integrated circuit, such as integrated circuit 400A-400B. In some embodiments, each power rail layout pattern of the set of power rail layout patterns 306 is located along a corresponding edge of a standard cell of layout design 300A. Other configurations or quantities of layout patterns in the set of power rail layout patterns 306 are within the scope of the present disclosure.

Layout design 300A further includes a set of cut feature layout patterns 308 extending in the first direction X. The set of cut feature layout patterns 308 includes one or more cut feature layout patterns. The set of cut feature layout patterns 308 overlaps at least gate layout pattern 304a or gate layout pattern 304b of the set of gate layout patterns 304. In some embodiments, each cut feature layout pattern of the set of cut feature layout patterns 308 overlaps corresponding gate layout patterns 304a, 304b of the set of gate layout patterns 304. Each layout pattern of the set of cut feature layout patterns 308 has a pattern width in the second direction Y, and a pattern length in the first direction X. In some embodiments, cut feature layout pattern 308 is usable to identify a location of gates 404a and 404b (FIG. 4A) of integrated circuit 400 that are removed during operation 106 of method 100 (FIG. 1). The removed gate portion of gates 404a and 404b is also referred to as a cut region. In some embodiments, the set of gate layout patterns 304 and the set of cut feature layout patterns 308 are located on the first layout level. Other configurations or quantities of patterns in the set of cut feature layout patterns 308 are within the scope of the present disclosure.

Layout design 300A further includes metal over diffusion layout patterns 310a, 310b (collectively referred to as a "set of metal over diffusion layout patterns 310") extending in the second direction Y. Each of the layout patterns of the set of metal over diffusion layout patterns 310 is separated from an adjacent layout pattern of the set of metal over diffusion layout patterns 310 in at least the first direction X or the second direction Y. The set of metal over diffusion layout patterns 310 is located on the first layout level. In some embodiments, the set of metal over diffusion layout patterns 310 is located on the metal over diffusion (MD) portion of the first layout level. The set of metal over diffusion layout patterns 310 is usable to manufacture a corresponding set of contacts 410a, 410b (FIG. 4A) of integrated circuit 400. The set of metal over diffusion layout patterns 310 are over one or more active region layout patterns (shown in FIGS. 6-9).

In some embodiments, the one or more active region layout patterns (shown in FIGS. 6-9) are referred to as oxide diffusion (OD) region layout patterns. In some embodiments, OD region layout patterns are usable to manufacture source or drain regions of one or more transistors. In some embodiments, the set of metal over diffusion layout patterns 310 are over one or more OD region layout patterns. Other configurations or quantities of layout patterns in the set of metal over diffusion layout patterns 310 are within the scope of the present disclosure.

Layout design 300A further includes one or more conductive feature layout patterns 314a, 314b, 314c, 314d, 314e, 314f (collectively referred to as a "set of conductive feature layout patterns 314") extending in the first direction X and being located on the second layout level. Set of conductive feature layout patterns 314 overlaps at least the set of gate layout patterns 304 or the set of metal over diffusion layout patterns 310. In some embodiments, one or more conductive feature layout pattern of the set of conductive feature layout patterns 314 is separated from an adjacent conductive feature layout pattern of the set of conductive feature layout patterns 314 in at least first direction X or the second direction Y. For example, conductive feature layout pattern 314a is separated in the first direction X from conductive feature layout pattern 314e. Similarly, conductive feature layout pattern 314c is separated in the first direction X from conductive feature layout pattern 314f.

The set of conductive feature layout patterns 314 is usable to manufacture a corresponding set of conductive structures 414 of the integrated circuit, such as integrated circuit 400A-400B (FIGS. 4A-4B). For example, conductive feature layout patterns 314b, 314d are usable to manufacture corresponding conductive structures 414b, 414d of integrated circuit 400A.

Conductive feature layout patterns 314a, 314b, 314c, 314d of the set of conductive feature layout patterns 314 overlap a corresponding gridline 302a, 302b, 302c, 302d (collectively referred to as "gridlines 302"). Conductive feature layout pattern 314e, 314f of the set of conductive feature layout patterns 314 overlaps corresponding gridline 302a, 302c.

Gridlines 302 are arranged in the first direction X. Each gridline of gridlines 302 is separated from an adjacent gridline of gridlines 302 by a pitch P1 (not labelled) in the second direction Y. In some embodiments, gridlines 302 define regions where conductive feature layout patterns in the set of conductive feature layout patterns 314 are positioned. In some embodiments, each of the gridlines 302 defines a corresponding M0 metal track position. In some embodiments, layout design 300A includes four M0 metal track positions (e.g., conductive feature layout patterns 314a, 314b, 314c, 314d) between the set of power rail layout patterns 306. As shown in FIG. 3A, a signal V1 is applied to each of conductive feature layout patterns 314b and 314d. Other configurations or quantities of conductive feature layout patterns in the set of conductive feature layout patterns 314 or gridlines 302 are within the contemplated scope of the present disclosure.

Layout design 300A further includes one or more via layout patterns 320a, 322a (collectively referred to as a "set of via layout patterns 320") over the set of metal over diffusion layout patterns 310. Set of via layout patterns 320 is usable to manufacture a corresponding set of vias 420 of integrated circuit 400A-400B (FIGS. 4A-4B). Set of via layout patterns 320 are positioned at a via over diffusion (VD) level of layout design 300. In some embodiments, the VD level is between the first layout level and the second layout level of one or more of layout designs 300A-300B, 500A-500B or 600-900 (FIGS. 3A-3B, 5A-5B or 6-9).

Via layout pattern 320a is located where conductive feature layout pattern 314d overlaps metal over diffusion layout pattern 310b of set of metal over diffusion layout patterns 310. Via layout pattern 320a is between conductive feature layout pattern 314d and metal over diffusion layout pattern 310b of the set of metal over diffusion layout patterns 310.

Via layout pattern 322a is located where conductive feature layout pattern 314b overlaps metal over diffusion layout pattern 310a of the set of metal over diffusion layout patterns 310. Via layout pattern 322a is between conductive feature layout pattern 314b and metal over diffusion layout pattern 310a of the set of metal over diffusion layout patterns 310. Other configurations or quantities of layout patterns in the set of via layout patterns 320 are within the scope of the present disclosure.

Layout design 300A further includes one or more via layout patterns 330, 332 (collectively referred to as a "set of via layout patterns 340") over the set of gate layout patterns 304. Set of via layout patterns 340 is usable to manufacture a corresponding set of vias 430 of integrated circuit 400A-400B. Via layout patterns 330, 332 is usable to manufacture corresponding via 430, 432 of integrated circuit 400A-400B (FIGS. 4A-4B). Set of via layout patterns 340 are positioned at a via over gate (VG) level of layout design 300. In some embodiments, the VG level is between the first layout level and the second layout level of one or more of layout designs 300A-300B, 500A-500B or 600-900 (FIGS. 3A-3B, 5A-5B or 6-9).

Via layout pattern 330 is located where power rail layout pattern 306a overlaps the gate layout pattern 304a of the set of gate layout patterns 304. Via layout pattern 330 is between power rail layout pattern 306a and gate layout pattern 304a of the set of gate layout patterns 304.

Via layout pattern 332 is located where power rail layout pattern 306b overlaps gate layout pattern 304a of the set of gate layout patterns 304. Via layout pattern 332 is between power rail layout pattern 306b and gate layout pattern 304a of the set of gate layout patterns 304. Other configurations or quantities of layout patterns in the set of via layout patterns 340 are within the scope of the present disclosure.

One or more of layout designs 300A-300B, 500A-500B or 600-900 (FIGS. 3A-3B, 5A-5B or 6-9) corresponds to a layout design of at least a portion of one or more cells. In some embodiments, a cell is a standard cell. In some embodiments, the cell includes one or more cross-coupled structures. In some embodiments, cross-coupled structures include at least two structures coupled to each other and share a same signal (e.g., control signal, supply voltage VDD or VSS). In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, a standard cell is a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drain. Examples of passive elements include, but are not limited to, capacitors, inductors, fuses, and resistors.

FIG. 3B is a diagram of a layout design 300B of an integrated circuit, in accordance with some embodiments.

Layout design 300B is usable to manufacture an integrated circuit similar to integrated circuit 400B of FIG. 4B. In some embodiments, layout design 300B corresponds to the revised first layout design of an integrated circuit after operation 206 in method 200 (FIG. 2).

Layout design 300B is a variation of layout design 300A (FIG. 3A).

In comparison with layout design 300A of FIG. 3A, set of conductive feature layout patterns 316 of FIG. 3B replaces set of conductive feature layout patterns 314, and similar detailed description is therefore omitted.

The set of conductive feature layout patterns 316 includes one or more conductive feature layout patterns 316a, 316b, 316c, 316d, 316e, 316f and 316g. Conductive feature layout pattern 316c is usable to manufacture conductive structure 416c of integrated circuit 400B (FIG. 4B).

Conductive feature layout patterns 316a and 316e replace corresponding conductive feature layout patterns 314a and 314e, and similar detailed description is therefore omitted. Conductive feature layout patterns 316b and 316f replace conductive feature layout pattern 314b, and similar detailed description is therefore omitted. Conductive feature layout pattern 316c replaces conductive feature layout patterns 314c, 314f, and similar detailed description is therefore omitted. Conductive feature layout patterns 316d and 316g replace conductive feature layout pattern 314d, and similar detailed description is therefore omitted.

In comparison with layout design 300A of FIG. 3A, via layout pattern 322b of FIG. 3B replaces via layout pattern 322a, and similar detailed description is therefore omitted. Via layout pattern 322b is usable to manufacture via 422b of integrated circuit 400B (FIG. 4B). Via layout pattern 322b is positioned between conductive feature layout pattern 316c and metal over diffusion layout pattern 312. In comparison with via layout pattern 322a of FIG. 3A, via layout pattern 322b is shifted one M0 pitch P1 in a third direction (e.g., negative Y direction). For example, via layout pattern 322b overlaps gridline 302c, and via layout pattern 322a of FIG. 3A overlaps gridline 302b. Other configurations or quantities of via layout pattern 322b are within the scope of the present disclosure.

In comparison with layout design 300A of FIG. 3A, metal over diffusion layout pattern 312 of set of metal over diffusion layout patterns 310' of FIG. 3B replaces metal over diffusion layout patterns 310a and 310b of set of metal over diffusion layout patterns 310. Metal over diffusion layout pattern 312 corresponds to the metal over diffusion layout patterns 310a and 310b not being separated from each other in the second direction Y, thus forming a single metal over diffusion layout pattern (e.g., metal over diffusion layout pattern 312). Metal over diffusion layout pattern 312 is similar to metal over diffusion layout patterns 310a, 310b, and similar detailed description is therefore omitted. Metal over diffusion layout pattern 312 is usable to manufacture a corresponding contact 412 (FIG. 4B) of integrated circuit 400. Other configurations or quantities of metal over diffusion layout pattern 312 are within the scope of the present disclosure.

Signal V1 is applied to a conductive structure 416c (FIG. 4B) manufactured by conductive feature layout pattern 316c.

Layout designs 300A and 300B illustrate one or more design rules of methods 100-200. In some embodiments, layout design 300B incorporates at least one or more MD design rules. For example, if the same signal V1 is applied to two or more conductive feature layout patterns (e.g., conductive feature layout patterns 314b and 314d) in FIG. 3A, and the conductive feature layout patterns 314b, 314d are coupled to corresponding metal over diffusion layout patterns 310a, 310b by corresponding via layout patterns 322a, 320a that are separated from each other in the second direction Y, then the metal over diffusion layout patterns 310a, 310b of FIG. 3A are merged to form a single metal over diffusion layout pattern (e.g. metal over diffusion layout pattern 312), and a single M0 metal track (e.g., conductive feature layout pattern 316c) is connected to the single metal over diffusion layout pattern (e.g. metal over diffusion layout pattern 312) as shown in FIG. 3B. In this example, as shown in FIG. 3B, a single M0 metal track (e.g., conductive feature layout pattern 316c) is connected to the single metal over diffusion layout pattern (e.g. metal over diffusion layout pattern 312) by via layout pattern 322b versus the dual-metal tracks M0 (e.g., conductive feature layout patterns 314b and 314d) as shown in FIG. 3A. In layout design 300B, routing resources are saved by reducing the use of one M0 metal track position (e.g., conductive feature layout pattern 316b or 316f) and one via layout pattern (e.g., via layout pattern 320a), and the saved M0 metal track position (e.g., conductive feature layout pattern 316b or 316f) are usable for the routing of other features.

In some embodiments, the layout design 300B implementation of the MD design rule of methods 100-200 of FIGS. 1-2, results in layout design 300B utilizing a single via layout pattern (e.g., via layout pattern 322b), a single conductive feature layout pattern (e.g., conductive feature layout pattern 316c), and a single metal over diffusion layout pattern (e.g., metal over diffusion layout pattern 312).

FIG. 4A is a diagram of an integrated circuit 400A, in accordance with some embodiments.

Structural relationships including alignment, lengths and widths, as well as configurations of integrated circuit 400A-400B are similar to the structural relationships and configurations of layout design 300A of FIG. 3A and layout design 300B of FIG. 3B, and will not be described in FIGS. 4A-4B for brevity.

Integrated circuit 400A is manufactured by layout design 300A. In some embodiments, integrated circuit 400A corresponds to the integrated circuit after operation 106 in method 100 (FIG. 1).

Integrated circuit 400 includes gates 404a and 404b (collectively referred to as "set of gates 404") extending in the second direction Y and being located on the first level of integrated circuit 400A. In some embodiments, the first level of integrated circuit 400A or 400B is referred to as the Poly level. Each of the gates of the set of gates 404 is separated from an adjacent gate of the set of gates 404 in at least the first direction X by a pitch P2 (not labelled). Gate 404a and gate 404b are separated from each other in the second direction Y. In some embodiments, gate 404a and 404b of FIG. 4A correspond to gate structures after operation 106 of method 100 of FIG. 1. Other quantities or configurations of the set of gates 404 are within the scope of the present disclosure.

Integrated circuit 400A further includes contacts 410a, 410b (collectively referred to as "set of contacts 410")

extending in the second direction Y and being located on the first level of integrated circuit 400A. Each of the contacts of the set of contacts 410 is separated from an adjacent contact of the set of contacts 410 in at least the first direction X. Contact 410a and contact 410b are separated from each other in the second direction Y. Other quantities or configurations of the set of contacts 410 are within the scope of the present disclosure.

Integrated circuit 400A further includes conductive structures 414a, 414b, 414c, 414d, 414e, 414f (collectively referred to as "set of conductive structures 414") extending in the first direction X. For ease of illustration, conductive structures 414a, 414c, 414e, 414f are not shown in FIG. 4A. Set of conductive structures 414 overlaps at least the set of gates 404 or the set of contacts 410. Set of conductive structures 414 is located on a second level of integrated circuit 400. In some embodiments, the second level of integrated circuit 400A is different from the first level. In some embodiments, the second level corresponds to the M0 level of integrated circuit 400A or 400B. Conductive structure 414b overlaps gate 404a and contact 410a. Conductive structure 414d overlaps gate 404b and contact 410b. Each of the conductive structures of the set of conductive structures 414 is separated from an adjacent conductive structure of the set of conductive structures 414 in at least the second direction Y. Conductive structure 414b overlaps and is aligned with gridline 302b, conductive structure 414d overlaps and is aligned with gridline 302d. Other quantities or configurations of the set of conductive structures 414 are within the scope of the present disclosure.

Integrated circuit 400A further includes vias 420a, 422a (collectively referred to as "set of vias 420") coupling the set of conductive structures 414 to the set of contacts 410. The set of vias 420 is between the set of conductive structures 414 and the set of contacts 410. Via 422a is located where conductive structure 414b overlaps contact 410a. Via 420a is located where conductive structure 414d overlaps contact 410b. Vias 420a, 422a are positioned at the VD level of integrated circuit 400A or 400B. Other quantities or configurations of the set of vias 420 are within the scope of the present disclosure.

Integrated circuit 400A further includes vias 430, 432 (collectively referred to as "set of vias 440") coupling a set of power rails (not shown) to the set of gates 404. The set of vias 440 is between the set of power rails (not shown) and the set of gates 404. Via 430 is located where a first power rail (not shown) of the set of power rails overlaps gate 404a. Via 432 is located where a second power rail (not shown) of the set of power rails overlaps gate 404b. Vias 430, 432 are positioned at the VG level of integrated circuit 400A or 400B. Other quantities or configurations of the set of vias 440 or the set of power rails (not shown) are within the scope of the present disclosure.

Conductive structures 414b and 414d are each configured to receive signal V1. Conductive structure 414b is electrically coupled to contact 410a by via 422a. Conductive structure 414d is electrically coupled to contact 410b by via 420a. In some embodiments, contact 410a is configured to receive signal V1 through via 422a and conductive structure 414b, and contact 410b is configured to receive signal V1 through via 420a and conductive structure 414d. In these embodiments, contacts 410a and 410b are both configured to receive signal V1 (e.g., configured to be at the same voltage level).

FIG. 4B is a diagram of an integrated circuit 400B, in accordance with some embodiments. Integrated circuit 400B is manufactured by layout design 300B. In some embodiments, integrated circuit 400B corresponds to the integrated circuit after operation 106 in method 100 (FIG. 1).

Integrated circuit 400B is a variation of integrated circuit 400A (FIG. 4A).

In comparison with integrated circuit 400A of FIG. 4A, contact 412 of FIG. 4A replaces contacts 410a, 410b, and similar detailed description is therefore omitted.

In comparison with integrated circuit 400A of FIG. 4A, conductive structure 416c of FIG. 4B replaces conductive structures 414b, 414d, and similar detailed description is therefore omitted.

In comparison with integrated circuit 400A of FIG. 4A, via 422b replaces vias 420a and 422a, and similar detailed description is therefore omitted.

Conductive structure 416c is configured to receive signal V1. Conductive structure 416c is electrically coupled to contact 412 by via 422b. In some embodiments, contact 412 is configured to receive signal V1 through via 422b and conductive structure 416c.

Integrated circuits 400A and 400B illustrate one or more design rules of methods 100-200. In some embodiments, integrated circuit 400B incorporates at least one or more MD design rules. For example, if the same signal V1 is applied to two or more conductive structures (e.g., conductive structures 414b and 414d) in FIG. 4A, and the conductive structures 414b, 414d are coupled to corresponding contacts 410a, 410b by corresponding vias 422a, 420a, and the contacts 410a, 410b are separated from each other in the second direction Y, then the contacts 410a, 410b of FIG. 4A are merged to form a single contact (e.g., contact 412) as shown in FIG. 4B. In this example, as shown in FIG. 4B, a single M0 metal track (e.g., conductive structure 416c) is electrically coupled to the single contact (e.g., contact 412) by via 422b versus the dual-metal tracks M0 (e.g., conductive structures 414b and 414d) as shown in FIG. 4A.

In integrated circuit 400B, routing resources are saved by reducing the use of one M0 metal track position (e.g., conductive structure 414b or 414d) and one via (e.g., via 420a or 422a), and the saved M0 metal track position (e.g., conductive structure 414b or 414d) can be used for the routing of other features.

In some embodiments, integrated circuit 400B implements one or more of the set of design rules of methods 100-200 of FIGS. 1-2, resulting in integrated circuit 400B utilizing a single via (e.g., via 422b), a single conductive structure (e.g., conductive structure 416c), and a single contact (e.g., contact 412).

FIG. 5A is a diagram of a layout design 500A of an integrated circuit, in accordance with some embodiments.

Layout design 500A is usable to manufacture an integrated circuit similar to integrated circuit 400A of FIG. 4A. In some embodiments, layout design 500A corresponds to the first layout design of an integrated circuit after operation 202 in method 200 (FIG. 2).

Layout design 500A includes rail layout patterns 306a and 306b and set of cut feature layout patterns 308 from layout design 300A or 300B of FIGS. 3A-3B, and similar detailed description is therefore omitted.

Layout design 500A further includes a set of gate layout patterns 504, a set of metal over diffusion layout patterns 510, a set of conductive feature layout patterns 514, a set of via layout patterns 520 and a set of via layout patterns 550.

Layout design 500A is a variation of layout design 300B (FIG. 3B).

In comparison with layout design 300B of FIG. 3B, set of gate layout patterns 504 of FIG. 5A replaces set of gate layout patterns 304, and similar detailed description is therefore omitted. Set of gate layout patterns 504 includes one or more of gate layout patterns 304a, 304b or 504a. Gate layout pattern 504a is similar to gate layout pattern 304a or 304b, and similar detailed description is therefore omitted. Other configurations or quantities of layout patterns in the set of gate layout patterns 504 are within the scope of the present disclosure.

In comparison with layout design 300B of FIG. 3B, set of metal over diffusion layout patterns 510 of FIG. 5A replaces set of metal over diffusion layout patterns 310', and similar detailed description is therefore omitted.

Set of metal over diffusion layout patterns 510 includes one or more of metal over diffusion layout patterns 312, 512, 513a or 513b. Set of metal over diffusion layout patterns 510 includes other layout patterns in FIG. 5A that are not labeled. Metal over diffusion layout pattern 512, 513a or 513b is similar to metal over diffusion layout pattern 312 of FIG. 3B, and similar detailed description is therefore omitted. Gate layout pattern 504a is positioned between metal over diffusion layout pattern 512 and metal over diffusion layout pattern 312. Metal over diffusion layout pattern 513a is positioned between gate layout pattern 304a and gate layout pattern 304b. Metal over diffusion layout pattern 513b is positioned between gate layout pattern 304a and gate layout pattern 304b. Metal over diffusion layout pattern 513a is separated from metal over diffusion layout pattern 513b in the second direction Y. Other configurations or quantities of layout patterns in the set of metal over diffusion layout patterns 510 are within the scope of the present disclosure.

In comparison with layout design 300B of FIG. 3B, set of conductive feature layout patterns 514 of FIG. 5A replaces set of conductive feature layout patterns 316, and similar detailed description is therefore omitted. The set of conductive feature layout patterns 514 includes one or more of conductive feature layout patterns 514a, 514b, 514c, 514d, 514e, 514f or 514g.

Conductive feature layout patterns 514a and 514e of FIG. 5A replace corresponding conductive feature layout patterns 316a, 316e of FIG. 3B, and similar detailed description is therefore omitted. Conductive feature layout pattern 514b of FIG. 5A replaces conductive feature layout patterns 316b, 316f of FIG. 3B, and similar detailed description is therefore omitted. Conductive feature layout patterns 514c and 514f of FIG. 5A replace conductive feature layout pattern 316c of FIG. 3B, and similar detailed description is therefore omitted. Conductive feature layout patterns 514d and 514g of FIG. 5A replace corresponding conductive feature layout patterns 316d, 316g of FIG. 3B, and similar detailed description is therefore omitted. Other configurations or quantities of layout patterns in the set of conductive feature layout patterns 514 are within the scope of the present disclosure.

Set of via layout patterns 520 includes one or more of via layout patterns 322b or 522a. Via layout pattern 322b is described in FIGS. 3A-3B, and similar detailed description is therefore omitted.

Via layout pattern 522a is similar to via layout pattern 322b of FIG. 3B, and similar detailed description is therefore omitted. Via layout pattern 522a is positioned between conductive feature layout pattern 514d and metal over diffusion layout pattern 512. Via layout pattern 522a is located where conductive feature layout pattern 514d overlaps metal over diffusion layout pattern 512. Via layout pattern 522a overlaps gridline 302d. Via layout pattern 522a is usable to manufacture a via (e.g. via 420a, 422a, 422b) of an integrated circuit, such as integrated circuit 400A, 400B (FIGS. 4A-4B). Via layout pattern 522a is positioned at the VD level of layout design 500A or 500B. Other configurations or quantities of via layout pattern 522a are within the scope of the present disclosure.

Set of via layout patterns 550 includes one or more of via layout patterns 540a, 542, 544 or 546a.

Via layout pattern 540a is similar to via layout pattern 330 or 332 of FIGS. 3A-3B, and similar detailed description is therefore omitted. Via layout pattern 540a is positioned between conductive feature layout pattern 514b and gate layout pattern 304a. Via layout pattern 540a is located where conductive feature layout pattern 514b overlaps gate layout pattern 304a. Via layout pattern 540a overlaps gridline 302b. Via layout pattern 540a is usable to manufacture a via (e.g. via 430, 432) of an integrated circuit, such as integrated circuit 400A, 400B (FIGS. 4A-4B). Via layout pattern 540a is positioned at the VG level of layout design 500A or 500B. Other configurations or quantities of via layout pattern 540a are within the scope of the present disclosure.

Via layout pattern 542 is similar to via layout pattern 330 or 332 of FIGS. 3A-3B, and similar detailed description is therefore omitted. Via layout pattern 542 is positioned between conductive feature layout pattern 514g and gate layout pattern 304a. Via layout pattern 542 is located where conductive feature layout pattern 514g overlaps gate layout pattern 304a. Via layout pattern 542 overlaps gridline 302d. Via layout pattern 542 is usable to manufacture a via (e.g. via 430, 432) of an integrated circuit, such as integrated circuit 400A, 400B (FIGS. 4A-4B). Via layout pattern 542 is positioned at the VG level of layout design 500A or 500B. Other configurations or quantities of via layout pattern 542 are within the scope of the present disclosure.

Via layout pattern 544 is similar to via layout pattern 330 or 332 of FIGS. 3A-3B, and similar detailed description is therefore omitted. Via layout pattern 544 is positioned between conductive feature layout pattern 514a and gate layout pattern 504a. Via layout pattern 544 is located where conductive feature layout pattern 514a overlaps gate layout pattern 504a. Via layout pattern 544 overlaps gridline 302a. Via layout pattern 544 is usable to manufacture a via (e.g. via 430, 432) of an integrated circuit, such as integrated circuit 400A, 400B (FIGS. 4A-4B). Via layout pattern 544 is positioned at the VG level of layout design 500A or 500B. Other configurations or quantities of via layout pattern 544 are within the scope of the present disclosure.

Via layout pattern 546a is similar to via layout pattern 330 or 332 of FIGS. 3A-3B, and similar detailed description is therefore omitted. Via layout pattern 546a is positioned between conductive feature layout pattern 514e and gate layout pattern 304b. Via layout pattern 546a is located where conductive feature layout pattern 514e overlaps gate layout pattern 304b. Via layout pattern 546a overlaps gridline 302a. Via layout pattern 546a is usable to manufacture a via (e.g. via 430, 432) of an integrated circuit, such as integrated circuit 400A, 400B (FIGS. 4A-4B). Via layout pattern 546a is positioned at the VG level of layout design 500A or 500B. Other configurations or quantities of via layout pattern 546a are within the scope of the present disclosure.

As shown in FIG. 5A, via layout pattern 540a is located less than one M0 metal track pitch P1 (not labelled) away from the set of cut feature layout patterns 308. Similarly, conductive feature layout pattern 514b is located less than one M0 metal track pitch P1 (not labelled) away from the set of cut feature layout patterns 308.

In some embodiments, a layout pattern located directly next to another layout pattern corresponds to a layout pattern located less than one pitch away from the other layout pattern. In some embodiments, each of via layout pattern 540a and conductive feature layout pattern 514b is located directly next to the set of cut feature layout patterns 308.

In some embodiments, via layout patterns located less than one M0 metal track pitch P1 (not labelled) away from cut feature layout patterns results in process limitations.

As shown in FIG. 5A, via layout pattern 542 and via layout pattern 544 are located at least one M0 metal track pitch P1 (not labelled) away from the set of cut feature layout patterns 308. Similarly, conductive feature layout pattern 514g and conductive feature layout pattern 514a are located at least one M0 metal track pitch P1 (not labeled) away from the set of cut feature layout patterns 308.

FIG. 5B is a diagram of a layout design 500B of an integrated circuit, in accordance with some embodiments.

Layout design 500B is usable to manufacture an integrated circuit similar to integrated circuit 400B of FIG. 4B. In some embodiments, layout design 500B corresponds to the revised first layout design of an integrated circuit after operation 206 in method 200 (FIG. 2).

Layout design 500B is a variation of layout design 500A (FIG. 5A).

In comparison with layout design 500A of FIG. 5A, set of conductive feature layout patterns 516 of FIG. 5B replaces set of conductive feature layout patterns 514, and similar detailed description is therefore omitted. The set of conductive feature layout patterns 516 includes one or more conductive feature layout patterns 516a, 516b, 516c, 516d, 516e, 516f and 516g. Conductive feature layout patterns 516a and 516e of FIG. 5B replace corresponding conductive feature layout patterns 514a and 514e of FIG. 5A, and similar detailed description is therefore omitted. Conductive feature layout pattern 516b and 516f of FIG. 5B replaces conductive feature layout pattern 514b of FIG. 5A, and similar detailed description is therefore omitted. Conductive feature layout patterns 516c of FIG. 5B replaces conductive feature layout patterns 514c and 514f of FIG. 5A, and similar detailed description is therefore omitted. Conductive feature layout patterns 516d and 516g of FIG. 5B replace corresponding conductive feature layout patterns 514d and 514g of FIG. 5A, and similar detailed description is therefore omitted. Other configurations or quantities of layout patterns in the set of conductive feature layout patterns 516 are within the scope of the present disclosure.

In comparison with layout design 500A of FIG. 5A, set of via layout patterns 520' of FIG. 5B replaces set of via layout patterns 520, and similar detailed description is therefore omitted. Set of via layout patterns 520' includes one or more of via layout patterns 522b or 522c.

In comparison with layout design 500A of FIG. 5A, via layout pattern 522b of FIG. 5B replaces via layout pattern 522a, and similar detailed description is therefore omitted. Via layout pattern 522b is between conductive feature layout pattern 516c and metal over diffusion layout pattern 512. Via layout pattern 522b is positioned where conductive feature layout pattern 516c overlaps metal over diffusion layout pattern 512. Via layout pattern 522b overlaps gridline 302c. Via layout pattern 522b is positioned at the VD level of layout design 500B. Other configurations or quantities of via layout pattern 522b are within the scope of the present disclosure.

In comparison with layout design 500A of FIG. 5A, via layout pattern 522c of FIG. 5B replaces via layout pattern 322b, and similar detailed description is therefore omitted. Via layout pattern 522c is between conductive feature layout pattern 516f and metal over diffusion layout pattern 312. Via layout pattern 522c is positioned where conductive feature layout pattern 516f overlaps metal over diffusion layout pattern 312. Via layout pattern 522c overlaps gridline 302b. Via layout pattern 522c is positioned at the VD level of layout design 500B. Other configurations or quantities of via layout pattern 522c are within the scope of the present disclosure.

In comparison with layout design 500A of FIG. 5A, set of via layout patterns 550' of FIG. 5B replaces set of via layout patterns 550, and similar detailed description is therefore omitted. Set of via layout patterns 550' includes one or more of via layout patterns 540b, 542, 544 or 546b.

In comparison with layout design 500A of FIG. 5A, via layout pattern 540b of FIG. 5B replaces via layout pattern 540a, and similar detailed description is therefore omitted. Via layout pattern 540b is positioned between conductive feature layout pattern 516e and gate layout pattern 304a. Via layout pattern 540b is positioned where conductive feature layout pattern 516e overlaps gate layout pattern 304a. In comparison with via layout pattern 540a of FIG. 5A, via layout pattern 540b is shifted one M0 pitch P1 in the second direction Y. For example, via layout pattern 540b overlaps gridline 302a. Via layout pattern 540b is positioned at the VG level of layout design 500B. Other configurations or quantities of via layout pattern 540b or set of via layout patterns 550' are within the scope of the present disclosure.

Layout designs 500A and 500B illustrate one or more design rules of methods 100-200. In some embodiments, layout design 500B incorporates at least one or more VG landing design rules or one or more M0 spacing design rules.

In some embodiments, if one or more VG via layout patterns (e.g., via layout patterns 540a, 542, 544 or 546a) in FIG. 5A, are located less than one M0 metal track pitch P1 (not labelled) away from the set of cut feature layout patterns 308, then during operation 106 of method 100 of the manufacturing process of an integrated circuit, using layout design 500A, may result in a lower manufacturing yield from process limitations. For example, during operation 106 of method 100, if the removed portion of the gate structure (e.g., the gate structure portion identified by the set of cut feature layout patterns 308) is not sufficiently separated from one or more VG vias (e.g., manufactured by the VG via layout patterns), then due to process limitations, either less surface area of the remaining gate structure is available for landing (e.g., forming) the one or more VG vias or portions of the one or more VG vias may also be removed during operation 106 resulting in a lower manufacturing yield.

In some embodiments, as shown in layout design 500B of FIG. 5B, in order to overcome these process limitations, one or more VG landing design rules of methods 100-200 include shifting VG via layout patterns (e.g., via layout pattern 540b) at least one M0 metal track position (e.g., pitch P1) away from the set of cut feature layout patterns 308 in the second direction Y, for VG via layout patterns (e.g., via layout patterns 540a, 542, 544 or 546a) located less than one M0 metal track pitch P1 (not labelled) away from the set of cut feature layout patterns 308.

By shifting VG via layout patterns (e.g., via layout patterns 540b, 542, 544 or 546b of layout design 500B) at least one M0 metal track pitch away from the set of cut feature layout patterns 308, one or more gate structures have additional VG via landing space to account for process limitations of the cut process of operation 106 of method 100. Therefore, by utilizing these one or more VG landing design rules, each of the VG via layout patterns (e.g., via layout patterns 540b, 542, 544 or 546b of layout design 500B) of layout design 500B is separated at least one M0 metal track pitch away from the set of cut feature layout patterns 308 as shown in FIG. 5B. In some embodiments, layout design 500B incorporates at least one or more VG landing design rules.

As shown in FIG. 5B, via layout patterns 540b, 542 and 544 are together positioned in a right-angled VG landing configuration. In some embodiments, layout design 500B incorporates one or more M0 metal track design rules of methods 100-200. In some embodiments, one or more M0 metal track design rules of methods 100-200 include separating conductive feature layout patterns in the first direction X. In some embodiments, one or more M0 metal track design rules are implemented in conjunction with VG landing design rules.

As shown in FIG. 5B, conductive feature layout patterns 516a and 516e are separated from each other in the first direction X. For example, by moving via layout pattern 540b one metal track position away from the set of cut feature layout patterns 308 in the second direction Y, and separating conductive feature layout patterns 516a and 516e in the first direction X, one M0 metal track position (e.g., conductive feature layout pattern 516f) is useable for other features yielding saved routing resources.

In this example, after moving via layout pattern 540b one metal track position away from the set of cut feature layout patterns 308, if conductive feature layout patterns 516a and 516e were not separated from each other in the first direction X, then gate layout patterns 304a and 504a would be coupled by conductive feature layout pattern 514a. In some embodiments, separating conductive feature layout patterns 516a and 516e prevents gate layout patterns 304a and 504a from being coupled to each other, and saves routing resources.

In layout design 500B, routing resources are saved by reducing the use of one M0 metal track position (e.g., conductive feature layout pattern 514b or 514e) of layout design 500A, and the saved M0 metal track position (e.g., conductive feature layout pattern 516e or 516f) of layout design 500B can be used for the routing of other features.

Figure 5C:
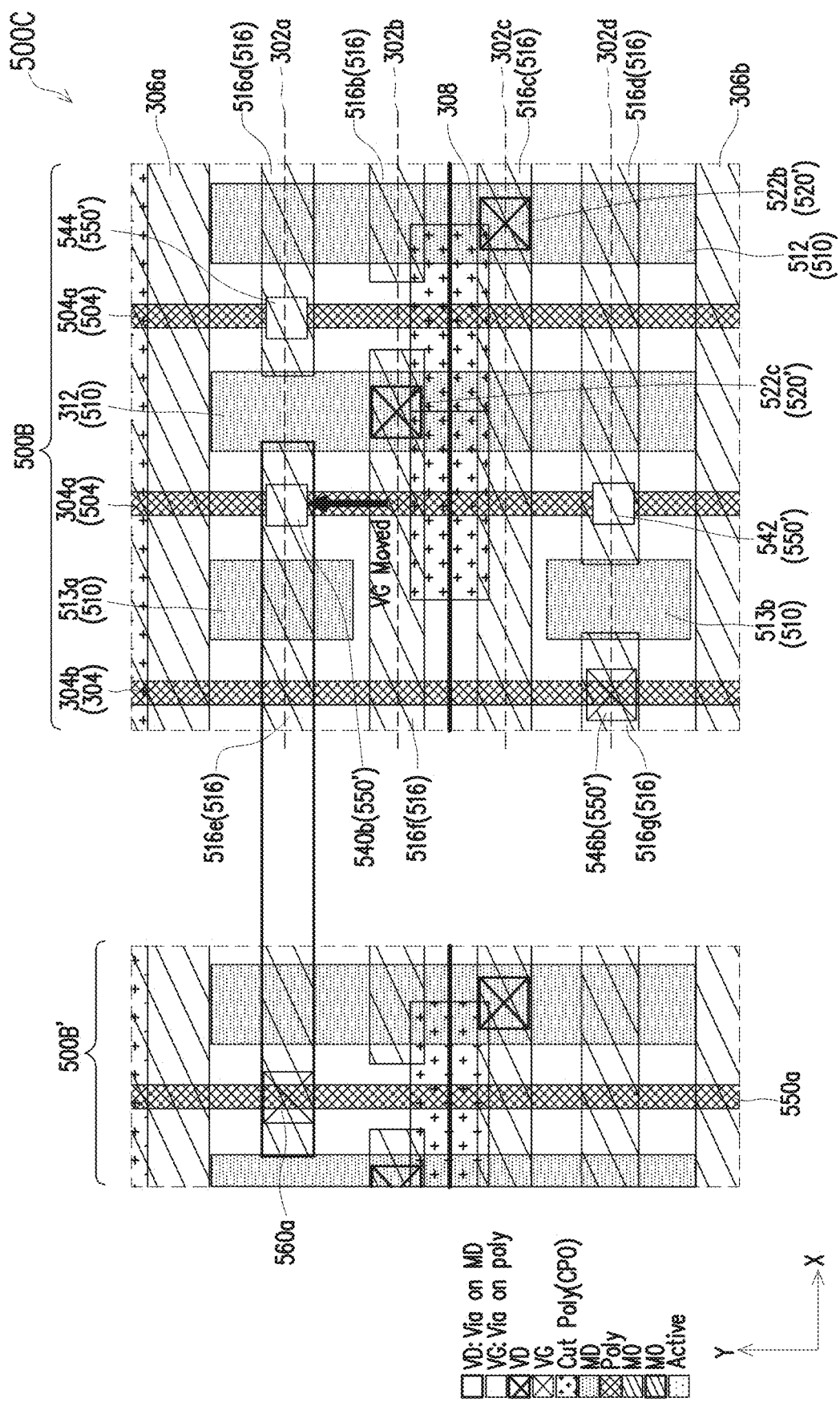
FIG. 5C is a diagram of a layout design of an integrated circuit, in accordance with some embodiments.

In some embodiments, by utilizing layout design 500B and the corresponding design rules, one or more of conductive feature layout patterns 516a, 516d, 516e or 516g is used to cross-couple the set of gate layout patterns 504 to one or more gate layout patterns of other devices (e.g., FIG. 5C). In some embodiments, set of gate layout patterns 504 is cross-coupled to one or more gate layout patterns of latches, transmission gates, multiplexers, or the like. For example, as shown in FIG. 5C, set of gate layout patterns 504 is cross-coupled to gate layout pattern 550a.

In some embodiments, the layout design 500B implementation of the design rule of methods 100-200 of FIGS. 1-2, results in layout design 500B utilizing VG via layout patterns (e.g., via layout pattern 540b, 542 and 544) that are separated from the set of cut feature layout patterns 308 by at least one M0 metal track position, and conductive feature layout patterns (e.g., conductive feature layout patterns 516a and 516e) that are separated from each other in the first direction X.

For example, if a VG via layout pattern is directly adjacent to a cut feature layout pattern, then the VG via layout pattern is moved one metal track position in the second direction or the third direction.

FIG. 5C is a diagram of a layout design 500C of an integrated circuit, in accordance with some embodiments.

Layout design 500C is usable to manufacture a portion of an integrated circuit similar to integrated circuit 400B of FIG. 4B. In some embodiments, layout design 500C corresponds to the revised first layout design of an integrated circuit after operation 206 in method 200 (FIG. 2).

Layout design 500C is a variation of layout design 500B (FIG. 5B). In comparison with layout design 500B of FIG. 5B, layout design 500C further includes layout design 500B'.

Layout design 500B' includes a gate layout pattern 550a and a via layout pattern 560a. Gate layout pattern 550a is similar to gate layout pattern 304a, via layout pattern 560a is similar to via layout pattern 540b, and similar detailed description is therefore omitted.

Layout design 500B' is cross-coupled to layout design 500B by at least conductive feature layout pattern 516e. For example, gate layout pattern 550a is cross-coupled to gate layout pattern 304a by via layout pattern 560a, via layout pattern 540b and conductive feature layout pattern 516e.

Figure 6:
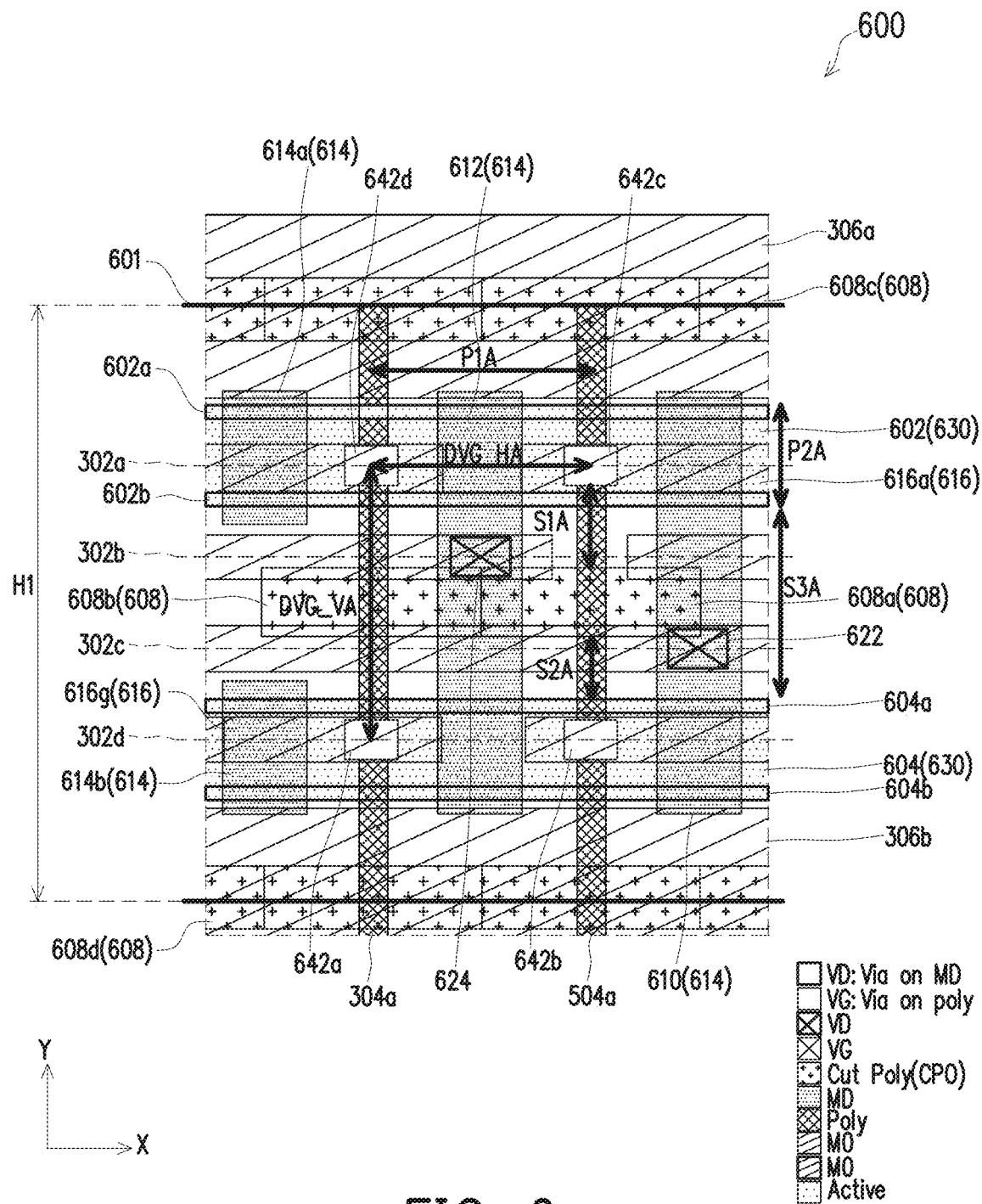
FIG. 6 is a diagram of a layout design of an integrated circuit, in accordance with some embodiments.

FIG. 6 is a diagram of a layout design 600 of an integrated circuit, in accordance with some embodiments.

Layout design 600 is usable to manufacture an integrated circuit similar to integrated circuit 400A of FIG. 4A or integrated circuit 400B of FIG. 4B.

In some embodiments, layout design 600 corresponds to the first layout design of an integrated circuit after operation 202 in method 200 (FIG. 2). In some embodiments, layout design 600 corresponds to the revised first layout design of an integrated circuit after operation 206 in method 200 (FIG. 2). In some embodiments, layout design 600 corresponds to a layout design of a standard cell 601 having a height H1 in the second direction Y.

Layout design 600 is a variation of layout design 500B (FIG. 5B).

Layout design 600 includes rail layout patterns 306a and 306b, and gate layout patterns 304a, 504a from layout design 500A or 500B of FIGS. 5A-5B, and similar detailed description is therefore omitted. Gate layout patterns 304a and 504a are separated from each other in the first direction X by a poly pitch P1A. Poly pitch P1A is measured from the center of gate layout patterns 304a and 504a.

Layout design 600 further includes active region layout patterns 602 and 604 (collectively referred to as "set of active region layout patterns 630") extending in a first direction X. Active region layout patterns 602, 604 of the set of active region layout patterns 630 are separated from one another in the second direction Y. The set of active region layout patterns 630 is usable to manufacture a corresponding set of active regions (not shown) of integrated circuit 400A or 400B. Gate layout patterns 304a and 504a overlap active region layout patterns 602 and 604. In some embodiments, the set of active region layout patterns 630 is located on a third layout level. In some embodiments, the third layout level is different from the first layout level and the second layout level. In some embodiments, the third layout level corresponds to the oxide-diffusion (OD) layout level. In some embodiments, the third layout level is below the first layout level and the second level. Other configurations or quantities of active region layout patterns 602 or 604 are within the scope of the present disclosure.

Layout design 600 further includes fin layout patterns 602a, 602b (collectively referred to as "set of fin layout patterns 603") each extending in the first direction X. Fin layout patterns 602a, 602b are over active region layout pattern 602. The set of fin layout patterns 603 are below the set of gate layout patterns 504. Each of the layout patterns of the set of fin layout patterns 603 is separated from an adjacent layout pattern of the set of fin layout patterns 603 in the second direction Y by a fin pitch P2A. Fin layout patterns 602a and 602b are separated from each other in the second direction Y by the fin pitch P2A. In some embodiments, fin pitch P2A is measured from the center of fin layout patterns 602a and 602b. The set of fin layout patterns 603 is usable to manufacture a corresponding set of fins (not shown) of integrated circuit 400A or 400B. Other configurations or quantities of layout patterns in the set of fin layout patterns 603 are within the scope of the present disclosure.

Layout design 600 further includes fin layout patterns 604a, 604b (collectively referred to as "set of fin layout patterns 605") each extending in the first direction X. Fin layout patterns 604a, 604b are over active region layout pattern 604. The set of fin layout patterns 605 are below the set of gate layout patterns 504. Each of the layout patterns of the set of fin layout patterns 605 is separated from an adjacent layout pattern of the set of fin layout patterns 605 in the second direction Y by the fin pitch P2A. Fin layout patterns 604a and 604b are separated from each other in the second direction Y by the fin pitch P2A. In some embodiments, fin pitch P2A is measured from the center of fin layout patterns 604a and 604b. The set of fin layout patterns 605 is usable to manufacture a corresponding set of fins (not shown) of integrated circuit 400A or 400B. Other configurations or quantities of layout patterns in the set of fin layout patterns 605 are within the scope of the present disclosure.

Layout design 600 further includes cut feature layout patterns 608a, 608b, 608c, and 608d (collectively referred to as "set of cut feature layout patterns 608") extending in the first direction X. In some embodiments, one or more cut feature layout patterns of the set of cut feature layout pattern 608 is separated from each other in at least the second direction Y. One or more cut feature layout patterns of the set of cut feature layout pattern 608 is similar to one or more cut feature layout patterns of the set of cut feature layout patterns 308, and similar detailed description is therefore omitted.

Cut feature layout pattern 608a and cut feature layout pattern 608b are positioned between gridlines 302b and 302c.

Cut feature layout pattern 608c includes one or more cut feature layout patterns. Cut feature layout pattern 608c overlaps a first side of standard cell 601.

Cut feature layout pattern 608d includes one or more cut feature layout patterns. Cut feature layout pattern 608d overlaps a second side of standard cell 601. The first side of standard cell 601 is on an opposite side of standard cell 601 from the second side of standard cell 601. Other configurations or quantities of cut feature layout patterns in the set of cut feature layout patterns 608 are within the scope of the present disclosure.

Layout design 600 further includes metal over diffusion layout patterns 610, 612, 614a, 614b (collectively referred to as "set of metal over diffusion layout patterns 614"). Set of metal over diffusion layout patterns 614 of layout design 600 is similar to the set of metal over diffusion layout patterns 510 of layout designs 500A-500B of FIGS. 5A-5B, and similar detailed description is therefore omitted. Metal over diffusion layout patterns 610, 612, 614a, 614b are similar to corresponding metal over diffusion layout patterns 510, 512, 513a, 513b of FIGS. 5A-5B, and similar detailed description is therefore omitted. Metal over diffusion layout patterns 614a and 614b are positioned next to gate layout pattern 304a. Metal over diffusion layout patterns 614a and 614b are separated from each other in the second direction Y. Metal over diffusion layout patterns 614a and 614b overlap corresponding active region layout patterns 602 and 604. Other configurations or quantities of layout patterns in the set of metal over diffusion layout patterns 614 are within the scope of the present disclosure.

Layout design 600 further includes one or more conductive feature layout patterns 616a, . . . , 616g (collectively referred to as a "set of conductive feature layout patterns 616"). Set of conductive feature layout patterns 616 is similar to the set of conductive feature layout patterns 516 of FIG. 5B, and similar detailed description is therefore omitted. Other configurations or quantities of layout patterns in the set of conductive feature layout patterns 616 are within the scope of the present disclosure.

Layout design 600 further includes one or more via layout patterns 642a, 642b, 642c and 642d (collectively referred to as a "set of via layout patterns 642").

Via layout patterns 642a, 642d, 642c are similar to corresponding via layout patterns 542, 540b, 544 of layout design 500B of FIG. 5B, and similar detailed description is therefore omitted. Via layout pattern 642b is similar to one or more of via layout patterns 542, 540b, 544 of layout design 500B of FIG. 5B, and similar detailed description is therefore omitted.

Via layout pattern 642a is positioned between conductive feature layout pattern 616g and gate layout pattern 304a. Via layout pattern 642a is positioned where conductive feature layout pattern 616g overlaps gate layout pattern 304a.

Via layout pattern 642b is positioned between conductive feature layout pattern 616d (not labelled) and gate layout pattern 504a. Via layout pattern 642b is positioned where conductive feature layout pattern 616d (not labelled) overlaps gate layout pattern 504a.

Via layout pattern 642c is positioned between conductive feature layout pattern 616a and gate layout pattern 504a. Via layout pattern 642c is positioned where conductive feature layout pattern 616a overlaps gate layout pattern 504a.

Via layout pattern 642d is positioned between conductive feature layout pattern 616e (not labelled) and gate layout pattern 304a. Via layout pattern 642d is positioned where conductive feature layout pattern 616e (not labelled) overlaps gate layout pattern 304a. Other configurations or quantities of one or via layout patterns of the set of via layout patterns 642 are within the scope of the present disclosure.

Via layout pattern 642a and via layout pattern 642d are separated from each other in the second direction Y by a distance DVG_VA. Via layout pattern 642b and via layout pattern 642c are separated from each other in the second direction Y by distance DVG_VA. In some embodiments, distance DVG_VA is measured from the center of via layout pattern 642a or 642b and corresponding via layout pattern 642d or 642c.

Via layout pattern 642a and via layout pattern 642b are separated from each other in the second direction Y by a distance DVG_HA. Via layout pattern 642c and via layout pattern 642d are separated from each other in the second direction Y by distance DVG_HA. In some embodiments, distance DVG_HA is measured from the center of via layout pattern 642a or 642c and corresponding via layout pattern 642b or 642d.

Each of the via layout patterns of the set of via layout patterns 642 is separated from the set of cut feature layout patterns 608 in the second direction Y by a distance S1A. For example, via layout pattern 642c or 642b is separated in the second direction Y from cut feature layout pattern 608a by distance S1A. Similarly, via layout pattern 642a or 642d is separated in the second direction Y from cut feature layout pattern 608b by distance S1A. In some embodiments, distance S1A is measured from the edge of via layout pattern 642c or 642b and the edge of cut feature layout pattern 608a.

In some embodiments, distance S1A is measured from the edge of via layout pattern 642a or 642d and the edge of cut feature layout pattern 608b.

The set of active region layout patterns 630 are separated from the set of cut feature layout patterns 608 in the second direction Y by a distance S2A. For example, active region layout pattern 604 is separated from cut feature layout pattern 608a or 608b in the second direction Y by distance S2A. Similarly, active region layout pattern 602 is separated from cut feature layout pattern 608a or 608b in the second direction Y by distance S2A. In some embodiments, distance S2A is measured from an edge of active region layout pattern 604 and the edge of cut feature layout pattern 608a or 608b. In some embodiments, distance S2A is measured from an edge of active region layout pattern 602 and the edge of cut feature layout pattern 608a or 608b.

Active region layout pattern 602 and active region layout pattern 604 are separated from each other in the second direction Y by a distance S3A. In some embodiments, distance S3A is measured from the edge of active region layout pattern 602 and the edge of active region layout pattern 604.

In some embodiments, a relationship between distance S3A and fin pitch P2A is expressed by formula 1:

$$S3A \leq 2.5 * P2A \quad (1)$$

In some embodiments, formula 1 corresponds to a relationship between the distance (e.g., S3A) between the active region layout patterns and the fin pitch (e.g., P2A) of the active region layout patterns.

In some embodiments, a relationship between distance S1A and distance S3A is expressed by formula 2:

$$S1A \geq 0.3 * S3A \quad (2)$$

In some embodiments, formula 2 corresponds to a relationship between the VG distance (e.g., S1A) between the set of via layout patterns 642 and the set of cut feature layout patterns 608, and the distance (e.g., S3A) between the active region layout patterns 602 and 604.

In some embodiments, a relationship between distance S2A and distance S3A is expressed by formula 3:

$$S2A \geq 0.2 * S3A \quad (3)$$

In some embodiments, formula 3 corresponds to a relationship between the set of cut feature layout patterns 608 and the set of active region layout patterns 630. In some embodiments, layout designs (e.g., layout design 600) that satisfy formula 3 result in the set of cut feature layout patterns 608 being sufficiently separated from the set of active region layout patterns 630 in order to overcome process limitations attributed to operation 106 of method 100.

In some embodiments, a relationship between distance DVG_HA and poly pitch P1A is expressed by formula 4:

$$1.1 * P1A \geq DVG\_HA \geq 0.9 * P1A \quad (4)$$

In some embodiments, formula 4 corresponds to a minimum and maximum distance relationship between gate layout patterns 304a and 504a in the first direction X. In some embodiments, formula 4 corresponds to a minimum and maximum distance relationship between VG via layout patterns (e.g., set of via layout patterns 642) in the first direction X.

In some embodiments, a relationship between distance S3A and distance DVG_HA is expressed by formula 5:

$$1.5 * S3A \geq DVG\_VA \geq 0.8 * S3A \quad (5)$$

In some embodiments, formula 5 corresponds to a minimum and maximum distance relationship between VG via layout patterns (e.g., set of via layout patterns 642) in the second direction Y.

In some embodiments, layout designs (e.g., layout design 600) that satisfy formulas 2 and 5 result in the set of via layout patterns 642 being sufficiently separated from the set of cut feature layout pattern 608 in order to overcome process limitations attributed to operation 106 of method 100.

In some embodiments, formulas 1-5 correspond to one or more design rules of layout design 600 and methods 100-200 of FIGS. 1-2. In some embodiments, layout designs that satisfy the one or more design rules specified by formulas 1-5 result in layout designs (e.g., layout design 600) which account for process limitations, and are capable of being used to consistently manufacture corresponding integrated circuits by semiconductor fabrication processes, such as methods 100-200 of FIGS. 1-2.

Figure 7:
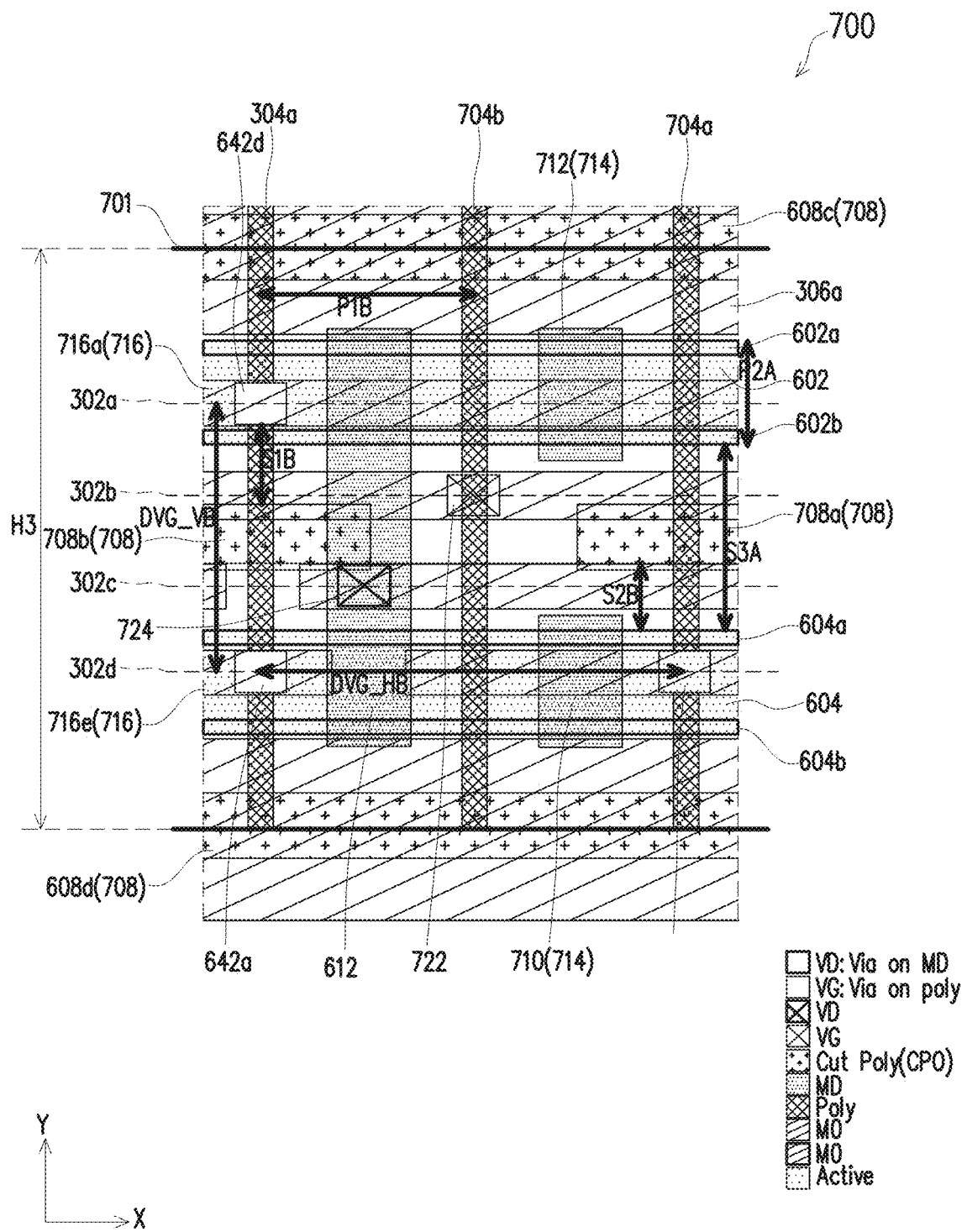
FIG. 7 is a diagram of a layout design of an integrated circuit, in accordance with some embodiments.

FIG. 7 is a diagram of a layout design 700 of an integrated circuit, in accordance with some embodiments.

Layout design 700 is usable to manufacture an integrated circuit similar to integrated circuit 400A of FIG. 4A or integrated circuit 400B of FIG. 4B.

In some embodiments, layout design 700 corresponds to the first layout design of an integrated circuit after operation 202 in method 200 (FIG. 2). In some embodiments, layout design 700 corresponds to the revised first layout design of an integrated circuit after operation 206 in method 200 (FIG. 2). In some embodiments, layout design 700 corresponds to a layout design of a standard cell 701 having a height H2 in the second direction Y.

Layout design 700 is a variation of layout design 500B of FIG. 5B or layout design 600 of FIG. 6.

Layout design 700 includes rail layout patterns 306a and 306b, and gate layout patterns 304a from layout design 500A or 500B of FIGS. 5A-5B, and similar detailed description is therefore omitted.

Layout design 700 further includes gate layout patterns 704a and 704b. Gate layout pattern 704a, 704b are similar to gate layout pattern 304b of FIG. 6, and similar detailed description is therefore omitted. Gate layout patterns 704a, 704b overlap active region layout patterns 602 and 604. Gate layout pattern 704b is between gate layout patterns 304a and 704a. Other configurations or quantities of gate layout patterns 304a, 704a or 704b are within the scope of the present disclosure.

Adjacent gate layout patterns of gate layout patterns 304a, 704a and 704b are separated from each other in the first direction X by a poly pitch P1B. Poly pitch P1B is measured from the center of gate layout patterns 304a, 704a and 704b.

Layout design 700 further includes active region layout patterns 602 and 604, fin layout patterns 602a and 602b, fin layout patterns 604a and 604b of layout design 600 of FIG. 6, and similar detailed description is therefore omitted. Other configurations or quantities of active region layout patterns 602 or 604, or fin layout patterns 602a, 602b, 604a or 604b are within the scope of the present disclosure.

Layout design 700 further includes cut feature layout patterns 708a, 708b, 608c, and 608d (collectively referred to as a "set of cut feature layout patterns 708") extending in the first direction X. In some embodiments, one or more cut feature layout patterns of the set of cut feature layout pattern 708 is separated from each other in at least the second direction Y. One or more cut feature layout patterns of the set of cut feature layout pattern 708 is similar to one or more cut feature layout patterns of the set of cut feature layout patterns 308 or 608, and similar detailed description is therefore omitted.

Cut feature layout patterns 708a and 708b are similar to corresponding cut feature layout patterns 608a and 608b, and similar detailed description is therefore omitted. Cut feature layout pattern 708a and cut feature layout pattern 708b are separated from each other in the first direction X. Cut feature layout patterns 708b and 708a overlap corresponding gate layout patterns 304a and 704a. Other configurations or quantities of cut feature layout patterns in the set of cut feature layout patterns 708 are within the scope of the present disclosure.

Layout design 700 further includes metal over diffusion layout patterns 612, 710, 712 (collectively referred to as a "set of metal over diffusion layout patterns 714").

Set of metal over diffusion layout patterns 714 of layout design 700 is similar to the set of metal over diffusion layout patterns 510 of FIG. 5A-5B or set of metal over diffusion layout patterns 614 of FIG. 6, and similar detailed description is therefore omitted. Metal over diffusion layout patterns 710, 712 are similar to corresponding metal over diffusion layout patterns 513a, 513b of FIGS. 5A-5B, and similar detailed description is therefore omitted. Metal over diffusion layout patterns 710 and 712 are positioned between gate layout patterns 704b, 704a. Metal over diffusion layout patterns 710 and 712 are separated from each other in the second direction Y. Metal over diffusion layout patterns 710 and 712 overlap corresponding active region layout patterns 602 and 604. Other configurations or quantities of layout patterns in the set of metal over diffusion layout patterns 714 are within the scope of the present disclosure.

Layout design 700 further includes one or more conductive feature layout patterns 716a, . . . , 716e (collectively referred to as a "set of conductive feature layout patterns 716").

Set of conductive feature layout patterns 716 is similar to the set of conductive feature layout patterns 516 of FIG. 5B, and similar detailed description is therefore omitted. Other configurations or quantities of layout patterns in the set of conductive feature layout patterns 716 are within the scope of the present disclosure.

Layout design 700 further includes one or more via layout patterns 642a, 642d and 742b (collectively referred to as a "set of via layout patterns 742"). Via layout pattern 742b is similar to via layout pattern 642b of layout design 600 of FIG. 6, and similar detailed description is therefore omitted.

Via layout pattern 642a of layout design 700 is positioned between conductive feature layout pattern 716e and gate layout pattern 304a. Via layout pattern 642a of layout design 700 is positioned where conductive feature layout pattern 716e overlaps gate layout pattern 304a.

Via layout pattern 642d of layout design 700 is positioned between conductive feature layout pattern 716a and gate layout pattern 304a. Via layout pattern 642d of layout design 700 is positioned where conductive feature layout pattern 716a overlaps gate layout pattern 304a.

Via layout pattern 742b is positioned between conductive feature layout pattern 716d (not labelled) and gate layout pattern 704a. Via layout pattern 742b is positioned where conductive feature layout pattern 716d (not labelled) overlaps gate layout pattern 704a. Other configurations or quantities of one or via layout patterns of the set of via layout patterns 742 are within the scope of the present disclosure.

In layout design 700, via layout pattern 642a and via layout pattern 642d are separated from each other in the second direction Y by a distance DVG_VB. In some embodiments, distance DVG_VB is measured from the center of via layout pattern 642a and via layout pattern 642d.

Via layout pattern 642a and via layout pattern 742b are separated from each other in the second direction Y by a distance DVG_HB. In some embodiments, distance DVG_HB is measured from the center of via layout pattern 642a and via layout pattern 742b.

Each of the via layout patterns of the set of via layout patterns 742 is separated from the set of cut feature layout patterns 708 in the second direction Y by a distance S1B. For example, via layout pattern 742b is separated in the second direction Y from cut feature layout pattern 708a by distance S1B (not labelled). Similarly, via layout pattern 642a or 642d is separated in the second direction Y from cut feature layout pattern 708b by distance S1B. In some embodiments, distance S1B is measured from the edge of via layout pattern 742b and the edge of cut feature layout pattern 708a. In some embodiments, distance S1B is measured from the edge of via layout pattern 642a or 642d and the edge of cut feature layout pattern 708b.

The set of active region layout patterns 630 are separated from the set of cut feature layout patterns 708 in the second direction Y by a distance S2B. For example, active region layout pattern 604 is separated from cut feature layout pattern 708a or 708b in the second direction Y by distance S2B. Similarly, active region layout pattern 602 is separated from cut feature layout pattern 708a or 708b in the second direction Y by distance S2B. In some embodiments, distance S2B is measured from an edge of active region layout pattern 604 and the edge of cut feature layout pattern 708a or 708b. In some embodiments, distance S2B is measured from an edge of active region layout pattern 602 and the edge of cut feature layout pattern 708a or 708b.

Active region layout pattern 602 and active region layout pattern 604 are separated from each other in the second direction Y by a distance S3A. In some embodiments, distance S3A is measured from the edge of active region layout pattern 602 and the edge of active region layout pattern 604.

In some embodiments, a relationship between distance S3A and fin pitch P2A is expressed by formula 6:

$$S3A \leq 2.5 * P2A \quad (6)$$

In some embodiments, formula 6 corresponds to a relationship between the distance (e.g., S3A) between the active region layout patterns and the fin pitch (e.g., P2A) of the active region layout patterns.

In some embodiments, a relationship between distance S1B and distance S3A is expressed by formula 7:

$$S1B \geq 0.3 * S3A \quad (7)$$

In some embodiments, formula 7 corresponds to a relationship between the VG distance (e.g., S1B) between the set of via layout patterns 742 and the set of cut feature layout patterns 708, and the distance (e.g., S3A) between the active region layout patterns 602 and 604.

In some embodiments, a relationship between distance S2B and distance S3A is expressed by formula 8:

$$S2B \geq 0.2 * S3A \quad (8)$$

In some embodiments, formula 8 corresponds to a relationship between the set of cut feature layout patterns 708 and the set of active region layout patterns 630. In some embodiments, layout designs (e.g., layout design 700) that satisfy formula 8 results in the set of cut feature layout patterns 708 being sufficiently separated from the set of active region layout patterns 630 in order to overcome process limitations attributed to operation 106 of method 100.

In some embodiments, a relationship between distance DVG_HB and poly pitch P1B is expressed by formula 9:

$$2.2*P1B \geq DVG\_HB \geq 0.9*P1B \qquad (9)$$

In some embodiments, formula 9 corresponds to a minimum and maximum distance relationship between adjacent gate layout patterns 304a, 704a and 704b in the first direction X. In some embodiments, formula 9 corresponds to a minimum and maximum distance relationship between VG via layout patterns (e.g., set of via layout patterns 742) in the first direction X.

In some embodiments, a relationship between distance S3A and distance DVG_HB is expressed by formula 10:

$$1.5*S3A \geq DVG\_VB \geq 0.8*S3A \qquad (10)$$

In some embodiments, formula 10 corresponds to a minimum and maximum distance relationship between VG via layout patterns (e.g., set of via layout patterns 742) in the second direction Y.

In some embodiments, layout designs (e.g., layout design 700) that satisfy formulas 7 and 10 results in the set of via layout patterns 742 being sufficiently separated from the set of cut feature layout patterns 708 in order to overcome process limitations attributed to operation 106 of method 100.

In some embodiments, formulas 6-10 correspond to one or more design rules of layout design 700 and methods 100-200 of FIGS. 1-2. In some embodiments, layout designs that satisfy the one or more design rules specified by formulas 6-10 results in layout designs (e.g., layout design 700) which account for process limitations, and are capable of being used to consistently manufacture corresponding integrated circuits by semiconductor fabrication processes, such as methods 100-200 of FIGS. 1-2.

FIG. 8 is a diagram of a layout design 800 of an integrated circuit, in accordance with some embodiments.

Layout design 800 is usable to manufacture an integrated circuit similar to integrated circuit 400A of FIG. 4A or integrated circuit 400B of FIG. 4B.

In some embodiments, layout design 800 corresponds to the first layout design of an integrated circuit after operation 202 in method 200 (FIG. 2). In some embodiments, layout design 800 corresponds to the revised first layout design of an integrated circuit after operation 206 in method 200 (FIG. 2). In some embodiments, layout design 800 corresponds to a layout design of a standard cell 870 having a height H3 in the second direction Y. In some embodiments, height H3 is twice the height H1 of standard cell 601. In some embodiments, height H3 is twice the height H2 of standard cell 701.

Layout design 800 is a variation of layout design 500B of FIG. 5B or layout design 600 of FIG. 6.

Layout design 800 includes a layout design 801A and a layout design 801B. Layout design 801A and layout design 801B are directly next to each other.

Layout design 801A is similar to layout design 600 of FIG. 6, and similar detailed description is therefore omitted.

In some embodiments, formulas 1-5, described with reference to layout design 600 of FIG. 6, are also applicable to layout design 801A, and similar detailed description is therefore omitted. In some embodiments, layout design 801A satisfies formulas 1-5 which corresponds to one or more design rules of layout design 800.

In comparison with layout design 600 of FIG. 6, set of cut feature layout patterns 608' of layout design 801A of FIG. 8 replaces set of cut feature layout patterns 608, and similar detailed description is therefore omitted. Set of cut feature layout patterns 608' includes one or more layout patterns of cut feature layout patterns 608a, 608b, 608c, 808e or 808f.

In comparison with layout design 600 of FIG. 6, cut feature layout patterns 808e and 808f of layout design 801A of FIG. 8 replace cut feature layout patterns 608d, and similar detailed description is therefore omitted. Cut feature layout patterns 808e and 808f are separated from each other in the first direction X. Cut feature layout patterns 808e and 808f overlap power rail layout pattern 306b.

In comparison with layout design 600 of FIG. 6, layout design 801A does not include via layout pattern 642b.

In comparison with layout design 600 of FIG. 6, gate layout patterns 304a and 504a of FIG. 8 extend in the first direction X across each of layout designs 801A and 801B.

In some embodiments, layout design 801B is a counter image of layout design 801A. In some embodiments a counter image of a layout corresponds to a rotated, mirror image of the layout. For example, in some embodiments, layout design 801B is a rotated, mirror image of layout design 801A.

Layout design 801B includes rail layout pattern 806b. Rail layout pattern 806b is similar to rail layout pattern 306a of layout design 500A or 500B of FIGS. 5A-5B, and similar detailed description is therefore omitted. Rail layout pattern 806b is positioned over a side of standard cell 870 opposite from the side of standard cell 870 that is overlapped by rail layout pattern 306a. Other configurations or quantities of rail layout patterns 306a, 306b or 806b are within the scope of the present disclosure.

Layout design 801B further includes active region layout patterns 802 and 804 (collectively referred to as "set of active region layout patterns 830") extend in the first direction X. Active region layout patterns 802 and 804 are similar to corresponding active region layout patterns 602 and 604, and similar detailed description is therefore omitted. Active region layout patterns 802 and 804 are separated from active region layout patterns 602 and 604 in the second direction Y. Gate layout patterns 304a and 504a overlap active region layout patterns 802 and 804. Other configurations or quantities of active region layout patterns 802 or 804 are within the scope of the present disclosure.

Layout design 801B further includes fin layout patterns 802a, 802b (collectively referred to as "set of fin layout patterns 803") each extending in the first direction X. Fin layout patterns 802a, 802b are over active region layout pattern 802. The set of fin layout patterns 803 are similar to the set of fin layout patterns 603 of FIG. 6 and similar detailed description is therefore omitted.

Layout design 801B further includes fin layout patterns 804a, 804b (collectively referred to as "set of fin layout patterns 805") each extending in the first direction X. Fin layout patterns 804a, 804b are over active region layout pattern 804. The set of fin layout patterns 805 are similar to the set of fin layout patterns 605 of FIG. 6 and similar detailed description is therefore omitted.

Each of the layout patterns of the set of fin layout patterns 803 or 805 is separated from an adjacent layout pattern of the corresponding set of fin layout patterns 803 or 805 in the second direction Y by a fin pitch P2C. Fin layout pattern 802a, 804a is separated from corresponding fin layout pattern 802b, 804b in the second direction Y by the fin pitch P2C. In some embodiments, fin pitch P2C is measured from the center of fin layout pattern 802a, 804a to the center of corresponding fin layout patterns 802b, 804b. Other configurations or quantities of layout patterns in the set of fin layout patterns 803 or 805 are within the scope of the present disclosure.

Layout design 801B further includes cut feature layout patterns 808a, 808b and 808d (collectively referred to as a "set of cut feature layout patterns 808") extending in the first direction X. In some embodiments, one or more cut feature layout patterns of the set of cut feature layout pattern 808 is separated from each other in at least the second direction Y. One or more cut feature layout patterns of the set of cut feature layout pattern 808 is similar to one or more cut feature layout patterns of the set of cut feature layout patterns 308, and similar detailed description is therefore omitted.

Cut feature layout pattern 808a and cut feature layout pattern 808b are positioned between gridlines 302b' and 302c'.

Cut feature layout pattern 808d includes one or more cut feature layout patterns. Cut feature layout pattern 808d is similar to cut feature layout pattern 608d of FIG. 6, and similar detailed description is therefore omitted.

Cut feature layout pattern 808d overlaps a first side of standard cell 870. Other configurations or quantities of cut feature layout patterns in the set of cut feature layout patterns 808 are within the scope of the present disclosure.

Layout design 801B further includes metal over diffusion layout patterns 810, 812, 814a, 814b (collectively referred to as a "set of metal over diffusion layout patterns 814"). Set of metal over diffusion layout patterns 814 of layout design 801B is similar to the set of metal over diffusion layout patterns 510 of layout designs 500A-500B of FIG. 5A-5B or set of metal over diffusion layout patterns 614 of FIG. 6, and similar detailed description is therefore omitted. Metal over diffusion layout patterns 810, 812, 814a, 814b are similar to corresponding metal over diffusion layout patterns 510, 512, 513a, 513b of FIGS. 5A-5B, and similar detailed description is therefore omitted. Metal over diffusion layout patterns 814a and 814b are positioned next to gate layout pattern 504a. Metal over diffusion layout patterns 814a and 814b are separated from each other in the second direction Y. Metal over diffusion layout patterns 814a and 814b overlap corresponding active region layout patterns 802 and 804. Other configurations or quantities of layout patterns in the set of metal over diffusion layout patterns 814 are within the scope of the present disclosure.

Layout design 801B further includes one or more conductive feature layout patterns 816a, . . . , 816g (collectively referred to as a "set of conductive feature layout patterns 816"). Set of conductive feature layout patterns 816 is similar to the set of conductive feature layout patterns 516 of FIG. 5B, and similar detailed description is therefore omitted.

Conductive feature layout pattern 816a overlaps gridlines 302a'. Conductive feature layout pattern 816b (not labeled) overlaps gridlines 302b'. Conductive feature layout patterns 816c (not labeled) and 816e (not labeled) overlap gridline 302c'. Conductive feature layout patterns 816d (not labeled) and 816g overlap gridline 302d'. Gridlines 302a', 302b', 302c', 302d' (collectively referred to as a "set of gridlines 302') are similar to the set of gridlines 302, and similar detailed description is therefore omitted. Other configurations or quantities of layout patterns in the set of conductive feature layout patterns 816 are within the scope of the present disclosure.

Layout design 801B further includes one or more via layout patterns 842a, 842c and 842d (collectively referred to as a "set of via layout patterns 842").

Via layout patterns 842a, 842d, 842c are similar to corresponding via layout patterns 542, 540b, 544 of layout design 500B of FIG. 5B, and similar detailed description is therefore omitted.

Via layout pattern 842a is positioned between conductive feature layout pattern 816d (not labeled) and gate layout pattern 504a. Via layout pattern 842a is positioned where conductive feature layout pattern 816d (not labeled) overlaps gate layout pattern 504a.

Via layout pattern 842d is positioned between conductive feature layout pattern 816a and gate layout pattern 504a. Via layout pattern 842d is positioned where conductive feature layout pattern 816a overlaps gate layout pattern 504a.

Via layout pattern 842c is positioned between conductive feature layout pattern 816g and gate layout pattern 304a. Via layout pattern 842c is positioned where conductive feature layout pattern 816g overlaps gate layout pattern 304a. Other configurations or quantities of one or via layout patterns of the set of via layout patterns 842 are within the scope of the present disclosure.

Via layout pattern 842a and via layout pattern 842d are separated from each other in the second direction Y by a distance DVG_VC1. In some embodiments, distance DVG_VC1 is measured from the center of via layout pattern 842a and via layout pattern 842d.

Via layout pattern 642c and via layout pattern 842d are separated from each other in the second direction Y by a distance DVG_VC2. In some embodiments, distance DVG_VC2 is measured from the center of via layout pattern 642c and via layout pattern 842d. Via layout pattern 642a and via layout pattern 842c are separated from each other in the second direction Y by a distance DVG_VC2. In some embodiments, distance DVG_VC2 is measured from the center of via layout pattern 642a and via layout pattern 842c.

Via layout pattern 842a and via layout pattern 842c are separated from each other in the second direction Y by a distance DVG_HC. In some embodiments, distance DVG_HC is measured from the center of via layout pattern 842a and via layout pattern 842c.

Each of the via layout patterns of the set of via layout patterns 842 is separated from the set of cut feature layout patterns 808 in the second direction Y by a distance S1C. For example, via layout pattern 842c is separated in the second direction Y from cut feature layout pattern 808b by distance S1C. Similarly, via layout pattern 842a or 842d is separated in the second direction Y from cut feature layout pattern 808a by distance S1C. In some embodiments, distance S1C is measured from the edge of via layout pattern 842a or 842d and the edge of cut feature layout pattern 808a. In some embodiments, distance S1A is measured from the edge of via layout pattern 842c and the edge of cut feature layout pattern 808b.

The set of active region layout patterns 830 are separated from the set of cut feature layout patterns 808 in the second direction Y by a distance S2C. For example, active region layout pattern 804 is separated from cut feature layout pattern 808a, 808d or 808b in the second direction Y by distance S2C. Similarly, active region layout pattern 802 is separated from cut feature layout pattern 808a, 808d or 808b in the second direction Y by distance S2C. In some embodiments, distance S2C is measured from an edge of active region layout pattern 804 and the edge of cut feature layout pattern 808a, 808d or 808b. In some embodiments, distance S2C is measured from an edge of active region layout pattern 802 and the edge of cut feature layout pattern 808a, 808d or 808b.

Active region layout pattern 802 and active region layout pattern 804 are separated from each other in the second direction Y by a distance S3C. In some embodiments, distance S3C is measured from the edge of active region layout pattern 802 and the edge of active region layout pattern 804.

In some embodiments, a relationship between distance S3C and fin pitch P2C is expressed by formula 11:

$$S3C \leq 2.5 * P2C \quad (11)$$

In some embodiments, formula 11 corresponds to a relationship between the distance (e.g., S3C) between the active region layout patterns and the fin pitch (e.g., P2C) of the active region layout patterns.

In some embodiments, a relationship between distance S1C and distance S3C is expressed by formula 12:

$$S1C \geq 0.3 * S3C \quad (12)$$

In some embodiments, formula 12 corresponds to a relationship between the VG distance (e.g., S1C) between the set of via layout patterns 842 and the set of cut feature layout patterns 808, and the distance (e.g., S3C) between the active region layout patterns 802 and 804.

In some embodiments, a relationship between distance S2C and distance S3C is expressed by formula 13:

$$S2C \geq 0.2 * S3C \quad (13)$$

In some embodiments, formula 13 corresponds to a relationship between the set of cut feature layout patterns 808 and the set of active region layout patterns 830. In some embodiments, layout designs (e.g., layout design 800) that satisfy formula 13 results in the set of cut feature layout patterns 808 being sufficiently separated from the set of active region layout patterns 830 in order to overcome process limitations attributed to operation 106 of method 100.

In some embodiments, a relationship between distance DVG_HC and poly pitch P1C is expressed by formula 14:

$$1.1 * P1C \geq DVG\_HC \geq 0.9 * P1C \quad (14)$$

In some embodiments, formula 14 corresponds to a minimum and maximum distance relationship between gate layout patterns 304a and 504a in the first direction X. In some embodiments, formula 14 corresponds to a minimum and maximum distance relationship between VG via layout patterns (e.g., set of via layout patterns 842) in the first direction X.

In some embodiments, a relationship between distance S3C and distance DVG_VC1 is expressed by formula 15:

$$1.5 * S3C \geq DVG\_VC1 \geq 0.8 * S3C \quad (15)$$

In some embodiments, formula 15 corresponds to a minimum and maximum distance relationship between VG via layout patterns (e.g., set of via layout patterns 842) in the second direction Y.

In some embodiments, a relationship between distance S3C and distance DVG_VC2 is expressed by formula 16:

$$3.6 * S3C \geq DVG\_VC2 \geq 2.3 * S3C \quad (16)$$

In some embodiments, formula 16 corresponds to a minimum and maximum distance relationship between VG via layout patterns (e.g., set of via layout patterns 642 and 842) in the second direction Y.

In some embodiments, layout designs (e.g., layout design 800) that satisfy formulas 12 and 15 results in the set of via layout patterns 842 being sufficiently separated from the set of cut feature layout pattern 808 in order to overcome process limitations attributed to operation 106 of method 100.

In some embodiments, formulas 1-5 and 11-16 correspond to one or more design rules of layout design 800 and methods 100-200 of FIGS. 1-2. In some embodiments, formulas 1-5 correspond to one or more design rules of layout design 801A, and formulas 11-16 correspond to one or more design rules of layout design 801B.

In some embodiments, layout designs that satisfy the one or more design rules specified by formulas 1-5 and 11-16 results in layout designs (e.g., layout design 800) which account for process limitations, and are capable of being used to consistently manufacture corresponding integrated circuits by semiconductor fabrication processes, such as methods 100-200 of FIGS. 1-2.

FIG. 9 is a diagram of a layout design 900 of an integrated circuit, in accordance with some embodiments.

Layout design 900 is usable to manufacture an integrated circuit similar to integrated circuit 400A of FIG. 4A or integrated circuit 400B of FIG. 4B.

In some embodiments, layout design 900 corresponds to the first layout design of an integrated circuit after operation 202 in method 200 (FIG. 2). In some embodiments, layout design 900 corresponds to the revised first layout design of an integrated circuit after operation 206 in method 200 (FIG. 2). In some embodiments, layout design 900 corresponds to a layout design of a standard cell 970 having a height H4 in the second direction Y. In some embodiments, height H4 is twice the height H1 of standard cell 601. In some embodiments, height H4 is twice the height H2 of standard cell 701. In some embodiments, height H4 is the same as height H3.

Layout design 900 is a variation of layout design 800 of FIG. 8.

In comparison with layout design 800 of FIG. 8, layout design 900 does not include elements of layout design 800 positioned between gridlines 880 and 882.

In some embodiments, formulas 1-5, described with reference to layout design 600 of FIG. 6, are also applicable to layout design 801A, and similar detailed description is therefore omitted. In some embodiments, layout design 801A satisfies formulas 1-5 which corresponds to one or more design rules of layout design 800.

In comparison with layout design 800 of FIG. 8, set of cut feature layout patterns 908 of layout design 900 replace set of cut feature layout patterns 608', and similar detailed description is therefore omitted. Set of cut feature layout patterns 908 includes one or more layout patterns of cut feature layout patterns 608a, 608b, 608c, 908a or 908b. In comparison with layout design 800 of FIG. 8, cut feature layout patterns 908a, 908b of layout design 900 replace cut feature layout patterns 808e, 808f, and similar detailed description is therefore omitted.

Cut feature layout patterns 908a and 908b are next to each other in the first direction X. Cut feature layout patterns 908a and 908b overlap power rail layout pattern 306b and gate layout pattern 304a. Other configurations or quantities of cut feature layout patterns in the set of cut feature layout patterns 908 are within the scope of the present disclosure.

In comparison with layout design 800 of FIG. 8, set of metal over diffusion layout patterns 914 of layout design 900 replace set of metal over diffusion layout patterns 814, and similar detailed description is therefore omitted. Set of metal over diffusion layout patterns 914 includes one or more layout patterns of metal over diffusion layout patterns 812, 914a or 914b. In comparison with layout design 800 of FIG. 8, metal over diffusion layout patterns 914a and 914b of layout design 900 replace metal over diffusion layout pattern 810, and similar detailed description is therefore omitted.

Metal over diffusion layout patterns 914a, 914b are similar to corresponding metal over diffusion layout patterns 614a, 614b of FIG. 6, and similar detailed description is therefore omitted. Metal over diffusion layout patterns 914a and 914b are separated from each other in the second direction Y. Metal over diffusion layout patterns 914a and 914b overlap corresponding active region layout patterns 802 and 804. One or more metal over diffusion layout patterns of the set of metal over diffusion layout patterns 310, 310', 510, 614, 714, 814 or 914 is useable to manufacture a corresponding contact (not labelled) similar to contact 410a, 410b of FIG. 4A or contact 412 of FIG. 4B. Other configurations or quantities of layout patterns in the set of metal over diffusion layout patterns 914 are within the scope of the present disclosure.

In comparison with layout design 800 of FIG. 8, set of via layout patterns 942 of layout design 900 replaces set of via layout patterns 842, and similar detailed description is therefore omitted. Set of via layout patterns 942 includes one or more layout patterns of via layout patterns 942a or 942d. In comparison with layout design 800 of FIG. 8, via layout pattern 942a of layout design 900 replaces via layout pattern 842c, and similar detailed description is therefore omitted. Via layout pattern 942d is similar to via layout pattern 642a, 642d or 842c of layout design 800 of FIG. 8, and similar detailed description is therefore omitted.

Via layout pattern 942a is positioned between conductive feature layout pattern 816d and gate layout pattern 304a. Via layout pattern 942a is positioned where conductive feature layout pattern 816d overlaps gate layout pattern 304a.

Via layout pattern 942d is positioned between conductive feature layout pattern 816a and gate layout pattern 304a. Via layout pattern 942d is positioned where conductive feature layout pattern 816a overlaps gate layout pattern 304a. Other configurations or quantities of one or via layout patterns of the set of via layout patterns 942 are within the scope of the present disclosure.

Via layout pattern 942a and via layout pattern 942d are separated from each other in the second direction Y by a distance DVG_VD1. In some embodiments, distance DVG_VD1 is measured from the center of via layout pattern 942a and via layout pattern 942d.

Via layout pattern 642a and via layout pattern 942d are separated from each other in the second direction Y by a distance DVG_VD2. In some embodiments, distance DVG_VD2 is measured from the center of via layout pattern 642a and via layout pattern 942d.

Each of the via layout patterns of the set of via layout patterns 942 is separated from the set of cut feature layout patterns 808 or 908 in the second direction Y by a distance S1D. For example, via layout pattern 942a is separated in the second direction Y from cut feature layout pattern 808b by distance S1D. Similarly, via layout pattern 942d is separated in the second direction Y from cut feature layout pattern 808b by distance S1D. In some embodiments, distance S1D is measured from the edge of via layout pattern 942a or 942d and the edge of cut feature layout pattern 808b.

Each of the via layout patterns of the set of via layout patterns 642 in layout design 900 is separated from the set of cut feature layout patterns 608' or 908 in the second direction Y by a distance S1D. For example, via layout pattern 642a is separated in the second direction Y from cut feature layout pattern 608b or 908a by distance S1D. Similarly, via layout pattern 642d is separated in the second direction Y from cut feature layout pattern 608b or 608c by distance S1D. In some embodiments, distance S1D is measured from the edge of via layout pattern 642a or 642d and the edge of cut feature layout pattern 608b, 608c or 908a.

The set of active region layout patterns 830 are separated from the set of cut feature layout patterns 808 or 908 in the second direction Y by distance S2D. For example, active region layout pattern 804 is separated from cut feature layout pattern 808a, 808d or 808b in the second direction Y by distance S2D. Similarly, active region layout pattern 802 is separated from cut feature layout pattern 808a, 808b, 908a or 908b in the second direction Y by distance S2D. In some embodiments, distance S2D is measured from an edge of active region layout pattern 804 and the edge of cut feature layout pattern 808a, 808d or 808b. In some embodiments, distance S2D is measured from an edge of active region layout pattern 802 and the edge of cut feature layout pattern 808a, 808b, 908a or 908b.

The set of active region layout patterns 630 are separated from the set of cut feature layout patterns 608' or 908 in the second direction Y by distance S2D. For example, active region layout pattern 604 is separated from cut feature layout pattern 608a, 608b, 908a or 908b in the second direction Y by distance S2D. Similarly, active region layout pattern 602 is separated from cut feature layout pattern 608a, 608b or 608c in the second direction Y by distance S2D. In some embodiments, distance S2D is measured from an edge of active region layout pattern 604 and the edge of cut feature layout pattern 608a, 608b, 908a or 908b. In some embodiments, distance S2D is measured from an edge of active region layout pattern 602 and the edge of cut feature layout pattern 608a, 608b or 608c.

Active region layout pattern 602, 802 of layout design 900 is separated in the second direction Y from the corresponding active region layout pattern 604, 804 by distance S3D. In some embodiments, distance S3D is measured from the edge of active region layout pattern 602, 802 and the edge of corresponding active region layout pattern 604, 804.

Fin layout pattern 602a, 604a, 802a, 804a of layout design 900 is separated from corresponding fin layout pattern 602b, 604b, 802b, 804b in the second direction Y by the fin pitch P2D. In some embodiments, fin pitch P2D is measured from the center of fin layout pattern 602a, 604a, 802a, 804a to the center of corresponding fin layout patterns 602b, 604b, 802b, 804b. Other configurations or quantities of layout patterns in the set of fin layout patterns 603, 605, 803 or 805 are within the scope of the present disclosure.

In some embodiments, a relationship between distance S3D and fin pitch P2D is expressed by formula 17:

$$S3D \leq 2.5 * P2D \quad (17)$$

In some embodiments, formula 17 corresponds to a relationship between the distance (e.g., S3D) between the active region layout patterns and the fin pitch (e.g., P2D) of the active region layout patterns.

In some embodiments, a relationship between distance S1D and distance S3D is expressed by formula 18:

$$S1D \geq 0.3 * S3D \quad (18)$$

In some embodiments, formula 18 corresponds to a relationship between the VG distance (e.g., S1D) between the set of via layout patterns 642 or 942 and the set of cut feature layout patterns 608', 808 or 908, and the distance (e.g., S3D) between the active region layout patterns 802 and 804 or active region layout patterns 602 and 604.

In some embodiments, a relationship between distance S2D and distance S3D is expressed by formula 19:

$$S2D \geq 0.2 * S3D \quad (19)$$

In some embodiments, formula 19 corresponds to a relationship between the set of cut feature layout patterns 608', 808 or 908 and the set of active region layout patterns 630 or 830. In some embodiments, layout designs (e.g., layout design 900) that satisfy formula 18 results in the set of cut feature layout patterns 608', 808 or 908 being sufficiently separated from the set of active region layout patterns 630 or 830 in order to overcome process limitations attributed to operation 106 of method 100.

In some embodiments, a relationship between distance S3D and distance DVG_VD1 is expressed by formula 20:

$$1.5*S3D \geq DVG\_VD1 \geq 0.8*S3D \quad (20)$$

In some embodiments, formula 20 corresponds to a minimum and maximum distance relationship between VG via layout patterns (e.g., set of via layout patterns 942) in the second direction Y.

In some embodiments, a relationship between distance S3D and distance DVG_VD2 is expressed by formula 21:

$$3.6*S3D \geq DVG\_VD2 \geq 2.3*S3D \quad (21)$$

In some embodiments, formula 21 corresponds to a minimum and maximum distance relationship between VG via layout patterns (e.g., set of via layout patterns 642 and 942) in the second direction Y.

In some embodiments, layout designs (e.g., layout design 900) that satisfy formulas 18 and 20 results in the set of via layout patterns 942 being sufficiently separated from the set of cut feature layout patterns 808 or 908 in order to overcome process limitations attributed to operation 106 of method 100.

In some embodiments, formulas 17-21 correspond to one or more design rules of layout design 900 and methods 100-200 of FIGS. 1-2.

In some embodiments, layout designs that satisfy the one or more design rules specified by formulas 17-21 results in layout designs (e.g., layout design 900) which account for process limitations, and are capable of being used to consistently manufacture corresponding integrated circuits by semiconductor fabrication processes, such as methods 100-200 of FIGS. 1-2.

Figure 10A:
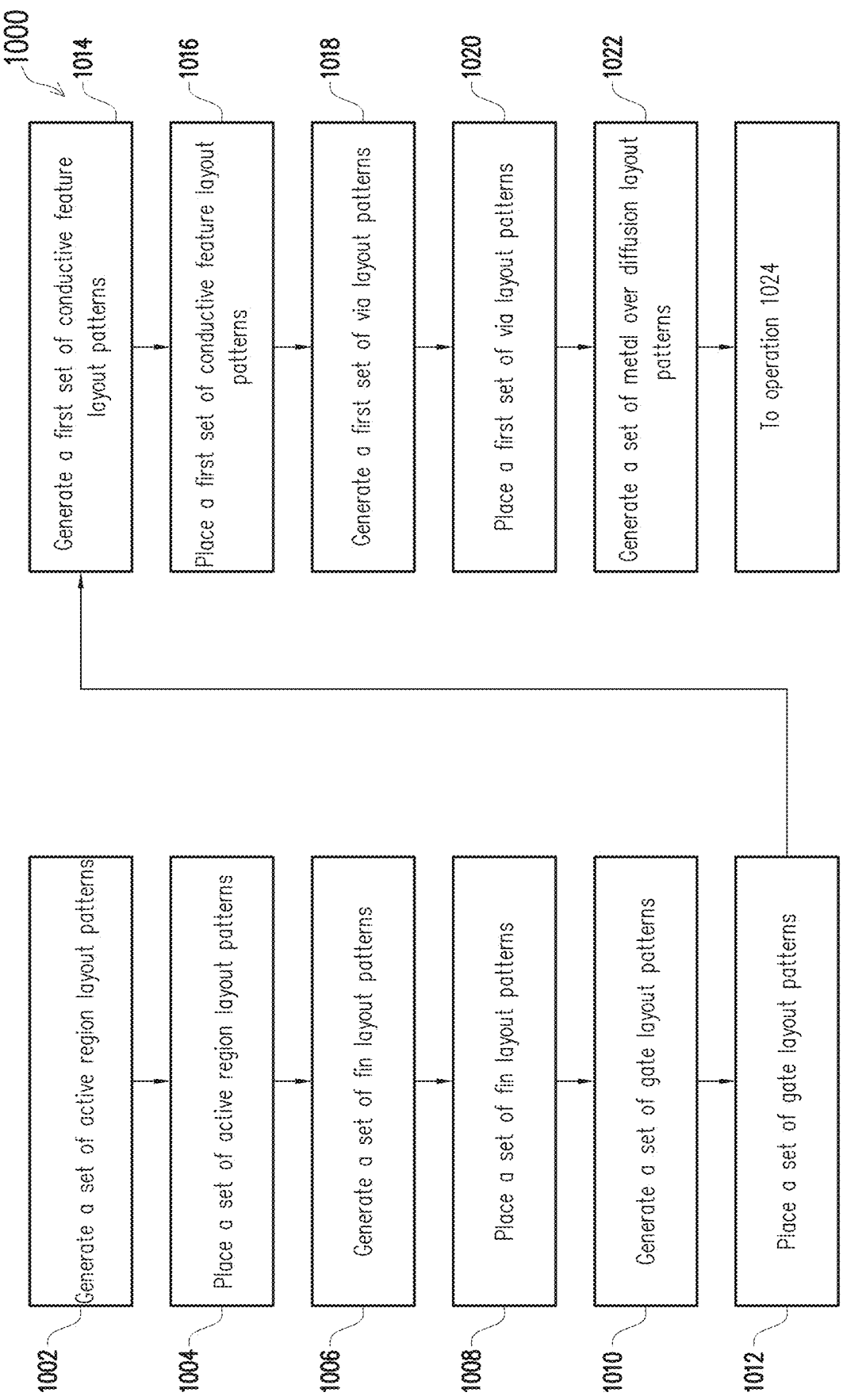
FIGS. 10A-10B is a flowchart of a method of generating a layout design of an integrated circuit, in accordance with some embodiments.
Figure 10B:
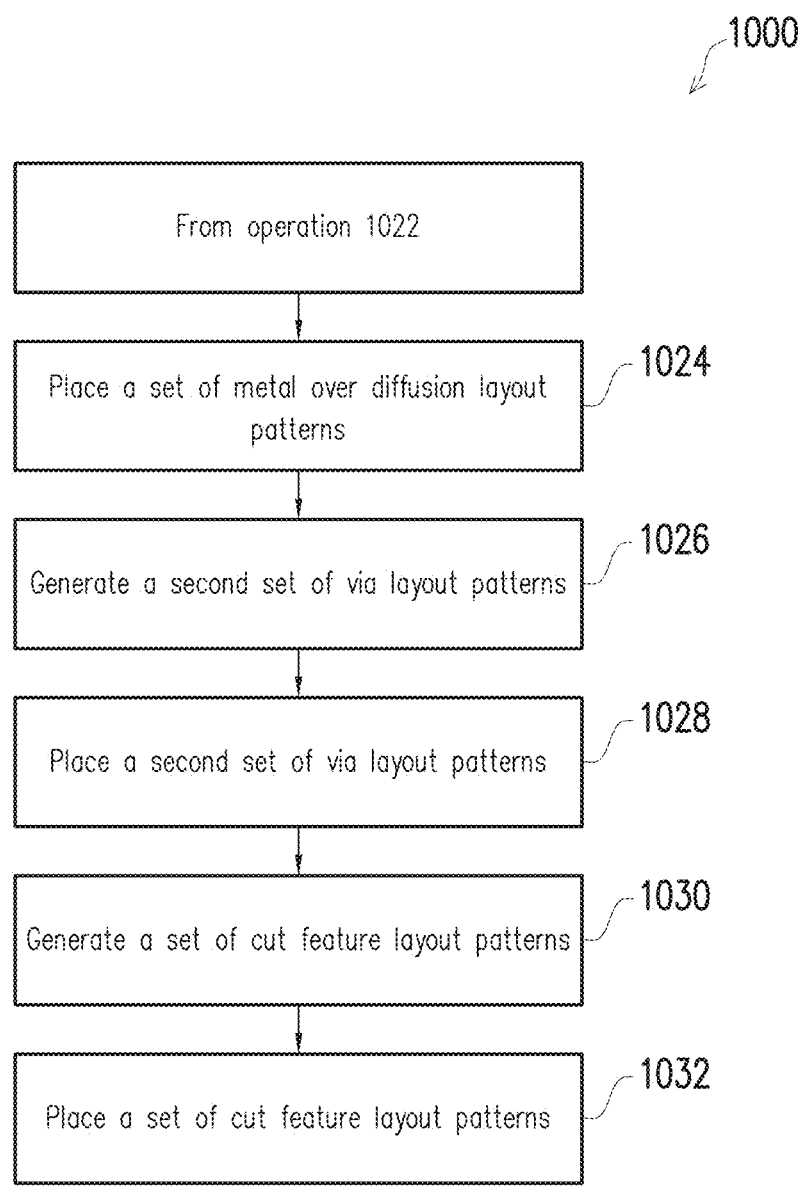

FIGS. 10A-10B is a flowchart of a method 1000 of generating a layout design of an integrated circuit in accordance with some embodiments. It is understood that additional operations may be performed before, during, and/or after the method 1000 depicted in FIGS. 10A-10B, and that some other processes may only be briefly described herein. In some embodiments, the method 1000 is usable to generate one or more layout designs, such as layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9) of an integrated circuit, such as integrated circuit 400A (FIG. 4A) or integrated circuit 400B (FIG. 4B). In some embodiments, method 1000 is performed by a processing device (e.g., processor 1102 (FIG. 11)) configured to execute instructions for generating layout design 300A (FIG. 3A), layout design 300B (FIG. 3B), layout design 500A (FIG. 5A), layout design 500B (FIG. 5B), layout design 600 (FIG. 6), layout design 700 (FIG. 7), layout design 800 (FIG. 8) or layout design 900 (FIG. 9). Method 1000 is an embodiment of operation 102 of method 100 (FIG. 1). In some embodiments, method 1000 is an implementation of method 200 (FIG. 2).

In operation 1002 of method 1000, a set of active region layout patterns is generated. In some embodiments, the set of active region layout patterns of method 1000 includes one or more patterns of the set of active region layout patterns 602, 604, 802, 804 of FIGS. 6-9, and detailed description of these layout patterns is therefore omitted.

In operation 1004 of method 1000, the set of active region layout patterns is placed on a first layout level of a layout design (e.g., layout design 300A-300B, 500A-500B or 600-900). In some embodiments, the first layout level of method 1000 corresponds to the OD layout level.

In operation 1006 of method 1000, a set of fin layout patterns is generated. In some embodiments, the set of fin layout patterns of method 1000 includes one or more patterns of the set of fin layout patterns 602a, 602b, 604a, 604b, 802a, 802b, 804a, 804b of FIGS. 6-9, and detailed description of these layout patterns is therefore omitted.

In operation 1008 of method 1000, the set of fin layout patterns is placed on a second layout level of the layout design (e.g., layout design 300A-300B, 500A-500B or 600-900). In some embodiments, the second layout level of method 1000 corresponds to the FIN layout level. In some embodiments, the second layout level of method 1000 is the same as the first layout level. In some embodiments, the second layout level of method 1000 is different from the first layout level. In some embodiments, the second layout level of method 1000 is above the first layout level. In some embodiments, the second layout level of method 1000 is below the first layout level.

In operation 1010 of method 1000, a set of gate layout patterns is generated. In some embodiments, the set of gate layout patterns of method 1000 includes one or more gate layout patterns 304a, 404b, 504a, 704a or 704b of layout designs 300A-300B, 500A-500B or 600-900 of FIGS. 3A-3B, 5A-5B & 6-9, and detailed description of these layout patterns is therefore omitted.

In operation 1012 of method 1000, the set of gate layout patterns is placed on a third layout level of layout design (e.g., layout design 300A-300B, 500A-500B or 600-900). In some embodiments, the third layout level of method 1000 corresponds to the Poly layout level or MD layout level. In some embodiments, the third layout level of method 1000 is different from the first layout level and the second layout level. In some embodiments, the third layout level of method 1000 is above one or more of the first or second layout level of method 1000. In some embodiments, the third layout level of method 1000 is below one or more of the first or second layout level.

In operation 1014 of method 1000, a first set of conductive feature layout patterns is generated. In some embodiments, the first set of conductive feature layout patterns of method 1000 includes one or more patterns of conductive feature layout patterns 306a, 306b, 314a, 314b, 314c, 314d, 314e, 314f, 316a, 316b, 316c, 316d, 316e, 316f, 316g, 516a, 516d, 516e, 516f, 516g or 806b of FIGS. 3A-3B, 5A-5B & 6-9, or one or more patterns of the set of conductive feature layout patterns 306, 314, 316, 516, 616, 716, 806, 816 or 916 of FIGS. 3A-3B, 5A-5B & 6-9 or one or more conductive feature layout patterns shown in layout designs 300A-300B, 500A-500B & 600-900, and detailed description of these layout patterns is therefore omitted. In some embodiments, the first set of conductive feature layout patterns of method 1000 includes a set of power rail layout patterns (e.g., set of power rail layout patterns 306 or 806), and detailed description of these layout patterns is therefore omitted.

In operation 1016 of method 1000, the first set of conductive feature layout patterns is placed on a fourth layout level of the layout design (e.g., layout design 300A-300B, 500A-500B or 600-900). In some embodiments, the fourth layout level of method 1000 corresponds to the M0 layout level. In some embodiments, the fourth layout level of method 1000 corresponds to the M1 or M2 layout level. In some embodiments, the fourth layout level of method 1000 is different from the first layout level, the second layout level or the third layout level of method 1000. In some embodiments, the fourth layout level of method 1000 is above one or more of the first layout level, the second layout level or the third layout level of method 1000. In some embodiments, the fourth layout level of method 1000 is below one or more of the first layout level, the second layout level or the third layout level of method 1000. In some embodiments, one or more conductive feature layout patterns of the first set of conductive feature layout patterns of method 1000 is placed on one or more of gridlines 302*a*, 302*b*, 302*c*, 302*d*, 302*a'*, 302*b'*, 302*c'* or 302*d'* of layout design 300A-300B, 500A-500B or 600-900.

In operation 1018 of method 1000, a first set of via layout patterns is generated. In some embodiments, the first set of via layout patterns of method 1000 includes one or more patterns of via layout patterns 330, 332, 540*a*, 540*b*, 542, 544, 642*a*, 642*b*, 642*c*, 642*d*, 722, 742*b*, 842*a*, 842*c*, 842*d*, 942*a* or 942*d* of FIGS. 3A-3B, 5A-5B & 6-9 or one or more via layout patterns shown in layout designs 300A-300B, 500A-500B & 600-900, or one or more via layout patterns in the set of via layout patterns 340, and detailed description of these layout patterns is therefore omitted.

In operation 1020 of method 1000, the first set of via layout patterns is placed between the third layout level and the fourth layout level of the layout design (e.g., layout design 300A-300B, 500A-500B or 600-900). In some embodiments, the first set of via layout patterns of method 1000 is placed on the VG layout level of the layout design (e.g., layout design 300A-300B, 500A-500B or 600-900). In some embodiments, the first set of via layout patterns of method 1000 is placed between the one or more gate layout patterns and the one or more conductive feature layout patterns of the first set of conductive feature layout patterns.

In operation 1022 of method 1000, a set of metal over diffusion layout patterns is generated. In some embodiments, the set of metal over diffusion layout patterns of method 1000 includes one or more layout patterns of metal over diffusion layout patterns 310*a*, 310*b*, 312, 512, 610, 612, 614*a*, 614*b*, 710, 712, 810, 812, 814*a*, 814*b*, 914*a* or 914*b* of FIGS. 3A-3B, 5A-5B & 6-9, or one or more metal over diffusion layout patterns shown in layout designs 300A-300B, 500A-500B & 600-900, and detailed description of these layout patterns is therefore omitted.

In operation 1024 of method 1000, the set of metal over diffusion layout patterns is placed on the third layout level of the layout design (e.g., layout design 300A-300B, 500A-500B or 600-900). In some embodiments, the third layout level of method 1000 corresponds to the MD layout level.

In operation 1026 of method 1000, a second set of via layout patterns is generated. In some embodiments, the second set of via layout patterns of method 1000 includes one or more patterns of via layout patterns 320*a*, 322*a*, 322*b*, 324, 522*b*, 622, 624, 724, 822 or 824 of FIGS. 3A-3B, 5A-5B & 6-9, or one or more via layout patterns shown in layout designs 300A-300B, 500A-500B & 600-900, or one or more via layout patterns in the set of via layout patterns 320, 320', and detailed description of these layout patterns is therefore omitted.

In operation 1028 of method 1000, the second set of via layout patterns is placed between the third layout level and the fourth layout level of the layout design (e.g., layout design 300A-300B, 500A-500B or 600-900). In some embodiments, the second set of via layout patterns of method 1000 is placed on the via over diffusion (VD) layout level of the layout design (e.g., layout design 300A-300B, 500A-500B or 600-900). In some embodiments, the second set of via layout patterns of method 1000 is placed between one or more metal over diffusion layout patterns of the set of metal over diffusion layout patterns and one or more conductive feature layout patterns of the first set of conductive feature layout patterns.

In operation 1030 of method 1000, a set of cut feature layout patterns is generated. In some embodiments, the set of cut feature layout patterns of method 1000 includes one or more cut feature layout patterns 308*a*, 308*b*, 608*a*, 608*b*, 608*c*, 608*d*, 708*a*, 708*b*, 808*a*, 808*b*, 808*e*, 808*f*, 908*a* or 908*b* of the set of cut feature layout patterns 308, 608, 708, 808 or 908, (FIG. 9) or one or more cut feature layout patterns shown in layout designs 300A-300B, 500A-500B & 600-900, and detailed description of these layout patterns is therefore omitted.

In operation 1032 of method 1000, the set of cut feature layout patterns is placed on one or more of the first, second, third or fourth layout level of the layout design (e.g., layout design 300A-300B, 500A-500B or 600-900).

In some embodiments, one or more of the operations of method 1000 is not performed.

One or more of the operations of methods 100, 200 or 1000 is performed by a processing device 1102 configured to execute instructions 1106 for manufacturing an integrated circuit, such as integrated circuit 400A-400B. In some embodiments, one or more operations of methods 100, 200 or 1000 is performed using a same processing device as that used in a different one or more operations of methods 100, 200 or 1000. In some embodiments, a different processing device is used to perform one or more operations of methods 100, 200 or 1000 from that used to perform a different one or more operations of methods 100, 200 or 1000.

FIG. 11 is a schematic view of a system 1100 for designing an IC layout design in accordance with some embodiments. In some embodiments, system 1100 generates or places one or more IC layout designs described herein. System 1100 includes a hardware processor 1102 and a non-transitory, computer readable storage medium 1104 encoded, i.e., storing, with the computer program code 1106, i.e., a set of executable instructions. Computer readable storage medium 1104 is configured for interfacing with manufacturing machines for producing the integrated circuit. The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described in method 100, 200 or 1000.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electromagnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform method 100, 200 or 1000. In some embodiments, the storage medium 1104 also stores information needed for performing method 100, 200 or 1000 as well as information generated during performing method 100, 200 or 1000, such as layout design 1116, user interface 1118 and design rules 1120, and/or a set of executable instructions to perform the operation of method 100, 200 or 1000. In some embodiments, layout design 1116 comprises one or more of layout designs 300A-300B, 500A-500B or 600-900. In some embodiments, layout design 1116 comprises one or more layout patterns of layout designs 300A-300B, 500A-500B or 600-900.

In some embodiments, the storage medium 1104 stores instructions (e.g., computer program code 1106) for interfacing with manufacturing machines. The instructions (e.g., computer program code 1106) enable processor 1102 to generate manufacturing instructions readable by the manufacturing machines to effectively implement method 100, 200 or 1000 during a manufacturing process.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-1394. In some embodiments, method 100, 200 or 1000 is implemented in two or more systems 1100, and information such as layout design, user interface and design rules, are exchanged between different systems 1100 by network 1114.

System 1100 is configured to receive information related to a layout design through I/O interface 1110 or network interface 1112. The information is transferred to processor 1102 by bus 1108 to determine a layout design for producing an integrated circuit, e.g., integrated circuit 400A-400B. The layout design is then stored in computer readable medium 1104 as layout design 1116. System 1100 is configured to receive information related to a user interface through I/O interface 1110 or network interface 1112. The information is stored in computer readable medium 1104 as user interface 1118. System 1100 is configured to receive information related to one or more design rules through I/O interface 1110 or network interface 1112. The information is stored in computer readable medium 1104 as design rules 1120. In some embodiments, the set of design rules 1120 includes one or more design rules of layout design 300A-300B, layout design 500A-500B or layout design 600-900. In some embodiments, the set of design rules 1120 includes one or more design rules of formulas 1-21, VG landing design rules of layout design 500A-500B, M0 metal track design rules of layout design 500-A-500B or MD design rules of layout design 300A-300B.

In some embodiments, method 100, 200 or 1000 is implemented as a standalone software application for execution by a processor. In some embodiments, method 100, 200 or 1000 is implemented as a software application that is a part of an additional software application. In some embodiments, method 100, 200 or 1000 is implemented as a plug-in to a software application. In some embodiments, method 100, 200 or 1000 is implemented as a software application that is a portion of an EDA tool. In some embodiments, method 100, 200 or 1000 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 100, 200 or 1000 is implemented by a manufacturing device to manufacture an integrated circuit (e.g., integrated circuit 400A-400B) using a set of masks manufactured based on one or more layout designs (e.g., layout design 300A-300B, 500A-500B, or 600-900) generated by system 1100. System 1100 of FIG. 11 generates layout designs (e.g., layout design 300A-300B, 500A-500B, or 600-900) of an integrated circuit (e.g, integrated circuit 400A-400B) that are smaller than other approaches. System 1100 of FIG. 11 generates layout designs (e.g., layout design 300A-300B, 500A-500B, or 600-900) of an integrated circuit (e.g, integrated circuit 400A-400B) that have improved gate density than other approaches. In some embodiments, by using one or more layout designs of the present application, the integrated circuit manufactured by the corresponding one or more layout designs has a gate density that is at least 10% greater compared to other approaches.

Figure 12:
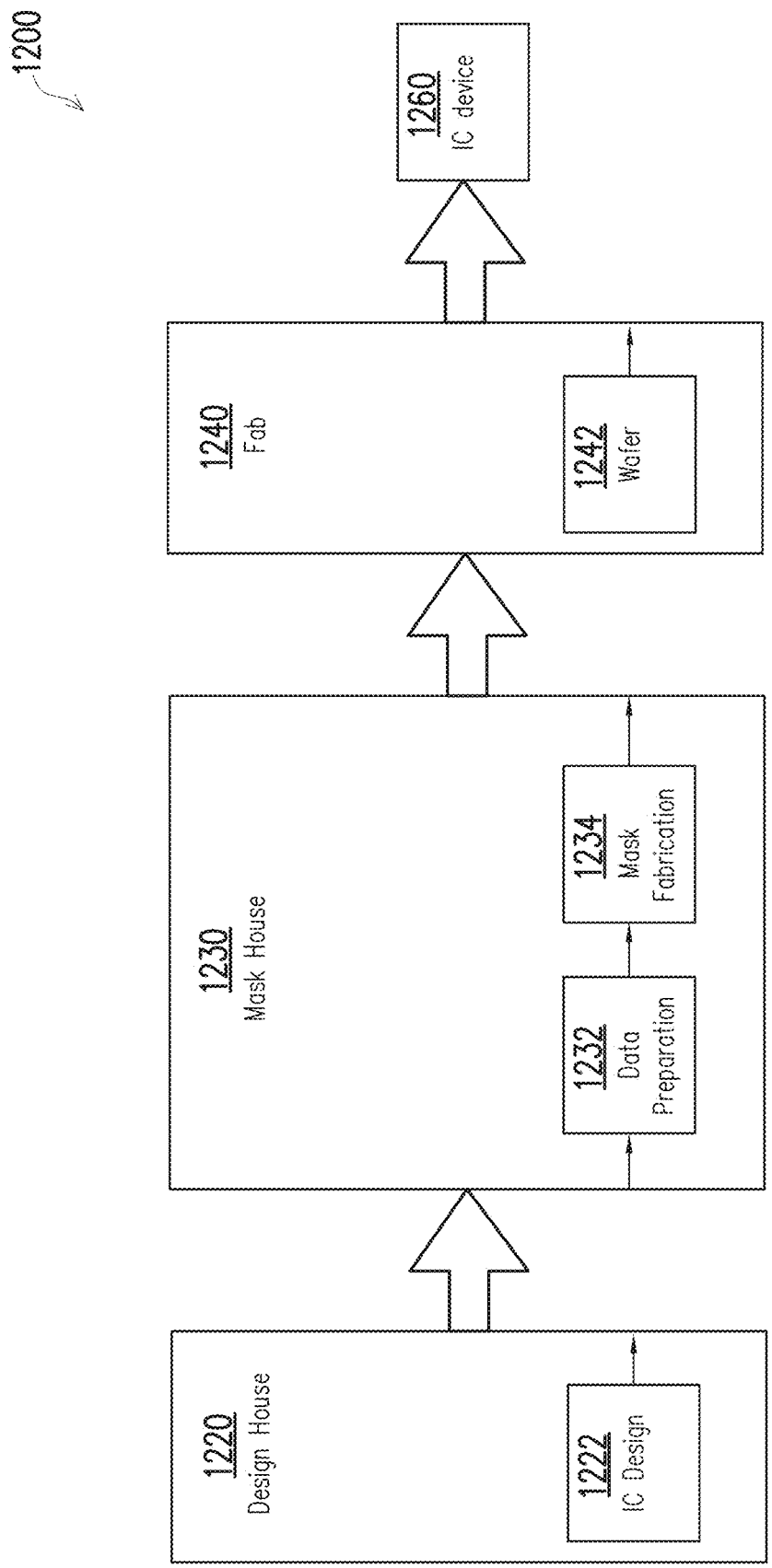
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with at least one embodiment of the present disclosure.

In FIG. 12, IC manufacturing system 1200 includes entities, such as a design house 1220, a mask house 1230, and an IC manufacturer/fabricator ("fab") 1240, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1240 is owned by a single larger company. In some embodiments, two or more of design house 1220, mask house 1230, and IC fab 1240 coexist in a common facility and use common resources.

Design house (or design team) 1220 generates an IC design layout 1222. IC design layout 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout 1222 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout 1222. The design procedure includes one or more of logic design, physical design or place and route. IC design layout 1222 is presented in one or more data files having information of the geometrical patterns. For example, IC design layout 1222 can be expressed in a GDSII file format or DFII file format.

Mask house 1230 includes data preparation 1232 and mask fabrication 1234. Mask house 1230 uses IC design layout 1222 to manufacture one or more masks to be used for fabricating the various layers of IC device 1260 according to IC design layout 1222. Mask house 1230 performs mask data preparation 1232, where IC design layout 1222 is translated into a representative data file ("RDF"). Mask data preparation 1232 provides the RDF to mask fabrication 1234. Mask fabrication 1234 includes a mask writer. A mask writer converts the RDF to an image on a substrate, such as a mask (reticle) or a semiconductor wafer. The design layout is manipulated by mask data preparation 1232 to comply with particular characteristics of the mask writer and/or requirements of IC fab 1240. In FIG. 12, mask data preparation 1232 and mask fabrication 1234 are illustrated as separate elements. In some embodiments, mask data preparation 1232 and mask fabrication 1234 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1234, which may undo part of the modifications performed by OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC design layout 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1222.

It should be understood that the above description of mask data preparation 1232 has been simplified for the purposes of clarity. In some embodiments, data preparation 1232 includes additional features such as a logic operation (LOP) to modify the IC design layout according to manufacturing rules. Additionally, the processes applied to IC design layout 1222 during data preparation 1232 may be executed in a variety of different orders.

After mask data preparation 1232 and during mask fabrication 1234, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1240 is an IC fabrication business that includes one or more manufacturing facilities for the fabrication of a variety of different IC products. In some embodiments, IC Fab 1240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1240 uses the mask (or masks) fabricated by mask house 1230 to fabricate IC device 1260. Thus, IC fab 1240 at least indirectly uses IC design layout 1222 to fabricate IC device 1260. In some embodiments, a semiconductor wafer 1242 is fabricated by IC fab 1240 using the mask (or masks) to form IC device 1260. Semiconductor wafer 1242 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method of forming an integrated circuit, the method includes generating, by a processor, a layout design of the integrated circuit based on a set of design rules, and manufacturing the integrated circuit based on the layout design, the integrated circuit having the first gate of the set of gate structures. In some embodiments, generating of the layout design includes generating a set of gate layout patterns corresponding to fabricating a set of gate structures of the integrated circuit, each of the layout patterns of the set of gate layout patterns being separated from an adjacent layout pattern of the set of gate layout patterns in a first direction by a first pitch, the set of gate layout patterns extending in a second direction different from the first direction and being located on a first layout level; generating a cut feature layout pattern corresponding to a cut region of a first gate of the set of gate structures of the integrated circuit, the cut feature layout pattern extending in the first direction, being located on the first layout level and overlapping at least a first gate layout pattern of the set of gate layout patterns; and generating a first via layout pattern, the first via layout pattern being over the first gate layout pattern of the set of gate layout patterns, and the first via layout pattern being separated in the second direction from the cut feature layout pattern by a first distance, the first distance satisfying a first design rule of the set of design rules. In some embodiments, generating the layout design of the integrated circuit layout pattern further includes generating a set of conductive feature layout patterns based on a second design rule of the set of design rules, the set of conductive feature layout patterns extending in the first direction, overlapping at least the first gate layout pattern of the set of gate layout patterns, and being located on a second layout level different from the first layout level, each of the layout patterns of the set of conductive feature layout patterns being separated from an adjacent layout pattern of the set of conductive feature layout patterns in the second direction by a second pitch. In some embodiments, the first via layout pattern is between a first conductive feature layout pattern of the set of conductive feature layout patterns and the first gate layout pattern of the set of gate layout patterns, the first via layout pattern being located where the first conductive feature layout pattern overlaps the first gate layout pattern of the set of gate layout patterns, and the first design rule of the set of design rules includes the first distance being greater than the second pitch. In some embodiments, generating the set of conductive feature layout patterns includes generating the first conductive feature layout pattern of the set of conductive feature layout patterns based on the second design rule of the set of design rules, the first conductive feature layout pattern overlapping the first gate layout pattern of the set of gate layout patterns; and generating a second conductive feature layout pattern of the set of conductive feature layout patterns based on the second design rule of the set of design rules, the second conductive feature layout pattern overlapping a second gate layout pattern of the set of gate layout patterns. In some embodiments, the first conductive feature layout pattern and the second conductive feature layout pattern of the set of conductive feature layout patterns are separated from each other in the first direction, and overlap a first metal track gridline extending in the first direction, and the second design rule of the set of design rules includes the first conductive feature layout pattern being separated from the second conductive feature layout pattern. In some embodiments, generating the layout design of the integrated circuit layout pattern further includes generating a second via layout pattern between the first conductive feature layout pattern and a second gate layout pattern of the set of gate layout patterns, the second gate layout pattern of the set of gate layout patterns being separated from the first gate layout pattern in the first direction, and the second via layout pattern being located where the first conductive feature layout pattern overlaps the second gate layout pattern of the set of gate layout patterns; and generating a third via layout pattern between a second conductive feature layout pattern and the first gate layout pattern of the set of gate layout patterns, and the third via layout pattern being located where the second conductive feature layout pattern overlaps the first gate layout pattern of the set of gate layout patterns. In some embodiments, the first via layout pattern, the second via layout pattern and the third via layout pattern are positioned in a right-angle configuration. In some embodiments, generating the layout design of the integrated circuit layout pattern further includes generating a set of conductive feature layout patterns based on a second design rule of the set of design rules, the set of conductive feature layout patterns corresponding to fabricating a set of conductive structures of the integrated circuit, the set of conductive feature layout patterns extending in the first direction, overlapping the set of gate layout patterns, and being located on a second layout level different from the first layout level, each of the layout patterns of the set of conductive feature layout patterns being separated from an adjacent layout pattern of the set of conductive feature layout patterns in the second direction by a second pitch; generating a first metal over diffusion layout pattern corresponding to fabricating a first metal over diffusion region of the integrated circuit, the first metal over diffusion layout pattern extending in the second direction, and being located on the first layout level; and generating a second via layout pattern between a first conductive feature layout pattern of the set of conductive feature layout patterns and the first metal over diffusion layout pattern, the second via layout pattern corresponding to fabricating a second via, the second via coupling a first conductive structure of the set of conductive structures to the first metal over diffusion region, and the second via layout pattern being located where the first conductive feature layout pattern of the set of conductive feature layout patterns overlaps the first metal over diffusion layout pattern. In some embodiments, generating the layout pattern further includes generating a set of active region layout patterns extending in the first direction, being below the set of gate layout patterns and the first metal over diffusion layout pattern, and being separated from one another in the first direction or the second direction, the set of active region layout patterns corresponding to fabricating a set of active regions of the integrated circuit. In some embodiments, the set of design rules further includes a set of distances between each of the via layout patterns of the layout design; and a set of distances between each of the active region layout patterns of the set of active region layout patterns. In some embodiments, manufacturing the integrated circuit based on the layout design includes manufacturing a set of masks based on the layout design; and manufacturing the integrated circuit based on the set of masks. In some embodiments, generating the layout design of the integrated circuit layout pattern further includes removing a portion of the first gate of the set of gate structures to form a first gate structure and a second gate structure, and the cut feature layout pattern identifying a location of the removed portion of the first gate of the set of gate structures. In some embodiments, the removing of the portion of the first gate includes performing an etch process on the removed portion of the first gate of the set of gate structures. In some embodiments, the removed portion of the first gate of the set of gate structures includes a cut width in the first direction, and a cut length in the second direction. In some embodiments, the cut feature layout pattern includes a pattern width in the first direction, and a pattern length in the second direction and the pattern width corresponds to the cut width, the pattern length corresponds to the cut length.

Another aspect of this description relates to an integrated circuit. The integrated circuit includes a set of gates, the first metal over diffusion region, a first conductive structure, the second conductive structure, a first via, a second via, the third conductive structure, and a third via. The set of gates having a first gate and a second gate separated from each other in a first direction by a first pitch, the set of gates extending in a second direction different from the first direction and being located on a first level. The first metal over diffusion region extending in the second direction, and being located on the first level. The first conductive structure extending in the first direction and being located on a second level different from the first level. The second conductive structure extending in the first direction, being separated from the first conductive structure in the second direction and being located on the second level. The first via between the first conductive structure and the first gate of the set of gates, the first via coupling the first conductive structure to the first gate of the set of gates, and the first via being located where the first conductive structure overlaps the first gate of the set of gates. The second via between the second conductive structure and the first metal over diffusion region, the second via coupling the second conductive structure to the first metal over diffusion region, and the second via being located where the second conductive structure overlaps the first metal over diffusion region. The third conductive structure extending in the first direction, being separated from the first conductive structure and the second conductive structure in the second direction and being located on the second level. The third via between the first conductive structure and the second gate of the set of gates, the third via coupling the third conductive structure to the second gate of the set of gates, and the third via being located where the third conductive structure overlaps the first gate of the set of gates. In some embodiments, the first conductive structure, the second conductive structure and the set of gates are coupled to each other as part of a cross-coupled structure. In some embodiments, the cross-coupled structure is a transmission gate.

Still aspect of this description relates to a method of manufacturing an integrated circuit. The method includes generating, by a processor, a layout design of the integrated circuit, the layout design having a set of design rules, manufacturing the integrated circuit based on the layout design, the integrated circuit having the first gate of the set of gate structures; and removing a portion of the first gate of the set of gate structures to form a first gate structure and a second gate structure, and the cut feature layout pattern identifying a location of the removed portion of the first gate of the set of gate structures. In some embodiments, the generating of the layout design includes placing a set of gate layout patterns and on a first layout level, the set of gate layout patterns corresponding to fabricating a set of gate structures of the integrated circuit, each of the layout patterns of the set of gate layout patterns being separated from an adjacent layout pattern of the set of gate layout patterns in a first direction by a first pitch, the set of gate layout patterns extending in a second direction different from the first direction; placing a cut feature layout pattern over the set of gate layout patterns, the cut feature layout pattern corresponding to a cut region of a first gate of the set of gate structures of the integrated circuit, the cut feature layout pattern extending in the first direction and overlapping at least a first gate layout pattern of the set of gate layout patterns; placing a first metal over diffusion layout pattern on the first layout level, the first metal over diffusion layout pattern corresponding to fabricating a first metal over diffusion region of the integrated circuit, and the first metal over diffusion layout pattern extending in the second direction; placing a first conductive feature layout pattern on a second layout level different from the first layout level, the first conductive feature layout pattern corresponding to fabricating a first conductive structure of the integrated circuit, and the first conductive feature layout pattern extending in the first direction; placing a second conductive feature layout pattern on the second layout level, the second conductive feature layout pattern corresponding to fabricating a second conductive structure of the integrated circuit, the second conductive feature layout pattern extending in the first direction, and being separated from the first conductive feature layout pattern in the second direction; placing a first via layout pattern between the first conductive feature layout pattern and the first gate layout pattern of the set of gate layout patterns, the first via layout pattern corresponding to fabricating a first via, the first via coupling the first conductive structure to the first gate of the set of gates, and the first via layout pattern being located where the first conductive feature layout pattern overlaps the first gate layout pattern of the set of gate layout patterns; and placing a second via layout pattern between the second conductive feature layout pattern and the first metal over diffusion layout pattern, the second via layout pattern corresponding to fabricating a second via, the second via coupling the second conductive structure to the first metal over diffusion region, and the second via layout pattern being located where the second conductive feature layout pattern overlaps the first metal over diffusion layout patterns. In some embodiments, the first conductive structure, the second conductive structure and the set of gates are coupled to each other as part of a cross-coupled structure. In some embodiments, the set of design rules of the layout design include a set of distances between the first via layout pattern and the second via layout pattern; a set of distances between the first metal over diffusion layout pattern and the first via layout pattern; the set of distances between the first metal over diffusion layout pattern and a set of active region layout patterns; or a set of distances between the first metal over diffusion layout pattern and the cut feature layout pattern. In some embodiments, the set of design rules of the layout design includes the second via layout pattern being separated in the second direction from the cut feature layout pattern by more than a first via pitch between adjacent via layout patterns. In some embodiments, generating the layout pattern further includes placing a set of active region layout patterns extending in the first direction, being below the set of gate layout patterns and the first diffusion layout pattern, and being separated from one another in the first direction or the second direction, the set of active region layout patterns corresponding to fabricating a set of active regions of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    generating, by a processor, a layout design of the integrated circuit based on a set of design rules, wherein the generating of the layout design comprises:
        generating a set of gate layout patterns corresponding to fabricating a set of gate structures of the integrated circuit, each of the layout patterns of the set of gate layout patterns being separated from an adjacent layout pattern of the set of gate layout patterns in a first direction by a first pitch, the set of gate layout patterns extending in a second direction different from the first direction and being located on a first layout level;
        generating a cut feature layout pattern corresponding to a cut region of a first gate of the set of gate structures of the integrated circuit, the cut feature layout pattern extending in the first direction, being located on the first layout level and overlapping at least a first gate layout pattern of the set of gate layout patterns; and
        generating a first via layout pattern, the first via layout pattern being over the first gate layout pattern of the set of gate layout patterns, and the first via layout pattern being separated in the second direction from the cut feature layout pattern by a first distance, the first distance satisfying a first design rule of the set of design rules; and
    manufacturing the integrated circuit based on the layout design, the integrated circuit having the first gate of the set of gate structures.

2. The method of claim 1, wherein generating the layout design of the integrated circuit further comprises:
    generating a set of conductive feature layout patterns based on a second design rule of the set of design rules, the set of conductive feature layout patterns extending in the first direction, overlapping at least the first gate layout pattern of the set of gate layout patterns, and being located on a second layout level different from the first layout level, each of the layout patterns of the set of conductive feature layout patterns being separated from an adjacent layout pattern of the set of conductive feature layout patterns in the second direction by a second pitch,
    wherein the first via layout pattern is between a first conductive feature layout pattern of the set of conductive feature layout patterns and the first gate layout pattern of the set of gate layout patterns, the first via layout pattern being located where the first conductive feature layout pattern overlaps the first gate layout pattern of the set of gate layout patterns, and
    the first design rule of the set of design rules includes the first distance being greater than the second pitch.

3. The method of claim 2, wherein generating the set of conductive feature layout patterns comprises:
    generating the first conductive feature layout pattern of the set of conductive feature layout patterns based on the second design rule of the set of design rules, the first conductive feature layout pattern overlapping the first gate layout pattern of the set of gate layout patterns; and
    generating a second conductive feature layout pattern of the set of conductive feature layout patterns based on the second design rule of the set of design rules, the second conductive feature layout pattern overlapping a second gate layout pattern of the set of gate layout patterns;
    wherein the first conductive feature layout pattern and the second conductive feature layout pattern of the set of conductive feature layout patterns are separated from each other in the first direction, and overlap a first metal track gridline extending in the first direction, and
    the second design rule of the set of design rules includes the first conductive feature layout pattern being separated from the second conductive feature layout pattern.

4. The method of claim 2, wherein generating the layout design of the integrated circuit further comprises:
    generating a second via layout pattern between the first conductive feature layout pattern and a second gate layout pattern of the set of gate layout patterns, the second gate layout pattern of the set of gate layout patterns being separated from the first gate layout pattern in the first direction, and the second via layout pattern being located where the first conductive feature layout pattern overlaps the second gate layout pattern of the set of gate layout patterns; and
    generating a third via layout pattern between a second conductive feature layout pattern and the first gate layout pattern of the set of gate layout patterns, and the third via layout pattern being located where the second conductive feature layout pattern overlaps the first gate layout pattern of the set of gate layout patterns.

5. The method of claim 4, wherein the first via layout pattern, the second via layout pattern and the third via layout pattern are positioned in a right-angle configuration.

6. The method of claim 1, wherein generating the layout design of the integrated circuit further comprises:
    generating a set of conductive feature layout patterns based on a second design rule of the set of design rules, the set of conductive feature layout patterns corresponding to fabricating a set of conductive structures of the integrated circuit, the set of conductive feature layout patterns extending in the first direction, overlapping the set of gate layout patterns, and being located on a second layout level different from the first layout level, each of the layout patterns of the set of conductive feature layout patterns being separated from an adjacent layout pattern of the set of conductive feature layout patterns in the second direction by a second pitch;
    generating a first metal over diffusion layout pattern corresponding to fabricating a first metal over diffusion region of the integrated circuit, the first metal over diffusion layout pattern extending in the second direction, and being located on the first layout level; and
    generating a second via layout pattern between a first conductive feature layout pattern of the set of conductive feature layout patterns and the first metal over diffusion layout pattern, the second via layout pattern corresponding to fabricating a second via, the second via coupling a first conductive structure of the set of conductive structures to the first metal over diffusion region, and the second via layout pattern being located where the first conductive feature layout pattern of the set of conductive feature layout patterns overlaps the first metal over diffusion layout pattern.

7. The method of claim 1, wherein generating the layout design of the integrated circuit further comprises:
generating a set of active region layout patterns extending in the first direction, being below the set of gate layout patterns and the first metal over diffusion layout pattern, and being separated from one another in the first direction or the second direction, the set of active region layout patterns corresponding to fabricating a set of active regions of the integrated circuit.

8. The method of claim 1, wherein the set of design rules further comprises:
a set of distances between via layout patterns of the layout design; and
a set of distances between each of the active region layout patterns of the set of active region layout patterns.

9. The method of claim 1, wherein manufacturing the integrated circuit based on the layout design comprises:
manufacturing a set of masks based on the layout design; and
manufacturing the integrated circuit based on the set of masks.

10. The method of claim 1, wherein generating the layout design of the integrated circuit further comprises:
removing a portion of the first gate of the set of gate structures to form a first gate structure and a second gate structure, and the cut feature layout pattern identifying a location of the removed portion of the first gate of the set of gate structures.

11. The method according to claim 10, wherein the removing of the portion of the first gate comprises:
performing an etch process on the removed portion of the first gate of the set of gate structures.

12. The method according to claim 10, wherein
the removed portion of the first gate of the set of gate structures comprises:
a cut width in the first direction, and
a cut length in the second direction;
the cut feature layout pattern comprises:
a pattern width in the first direction, and
a pattern length in the second direction;
the pattern width corresponds to the cut width, the pattern length corresponds to the cut length.

13. An integrated circuit, comprising:
a set of gates having a first gate and a second gate separated from each other in a first direction by a first pitch, the set of gates extending in a second direction different from the first direction and being located on a first level;
a first metal over diffusion region extending in the second direction, and being located on the first level;
a first conductive structure extending in the first direction and being located on a second level different from the first level;
a second conductive structure extending in the first direction, being separated from the first conductive structure in the second direction and being located on the second level;
a first via between the first conductive structure and the first gate of the set of gates, the first via coupling the first conductive structure to the first gate of the set of gates, and the first via being located where the first conductive structure overlaps the first gate of the set of gates;
a second via between the second conductive structure and the first metal over diffusion region, the second via coupling the second conductive structure to the first metal over diffusion region, and the second via being located where the second conductive structure overlaps the first metal over diffusion region;
a third conductive structure extending in the first direction, being separated from the first conductive structure and the second conductive structure in the second direction and being located on the second level; and
a third via between the third conductive structure and the second gate of the set of gates, the third via coupling the third conductive structure to the second gate of the set of gates, and the third via being located where the third conductive structure overlaps the second gate of the set of gates.

14. The integrated circuit of claim 13, wherein the first conductive structure, the second conductive structure and the set of gates are coupled to each other as part of a cross-coupled structure.

15. The integrated circuit of claim 14, wherein the cross-coupled structure is a transmission gate.

16. A method of forming an integrated circuit, the method comprising:
generating, by a processor, a layout design of the integrated circuit, the layout design having a set of design rules, wherein the generating of the layout design comprises:
placing a set of gate layout patterns and on a first layout level, the set of gate layout patterns corresponding to fabricating a set of gate structures of the integrated circuit, each of the layout patterns of the set of gate layout patterns being separated from an adjacent layout pattern of the set of gate layout patterns in a first direction by a first pitch, the set of gate layout patterns extending in a second direction different from the first direction;
placing a cut feature layout pattern over the set of gate layout patterns, the cut feature layout pattern corresponding to a cut region of a first gate of the set of gate structures of the integrated circuit, the cut feature layout pattern extending in the first direction and overlapping at least a first gate layout pattern of the set of gate layout patterns;
placing a first metal over diffusion layout pattern on the first layout level, the first metal over diffusion layout pattern corresponding to fabricating a first metal over diffusion region of the integrated circuit, and the first metal over diffusion layout pattern extending in the second direction;
placing a first conductive feature layout pattern on a second layout level different from the first layout level, the first conductive feature layout pattern corresponding to fabricating a first conductive structure of the integrated circuit, and the first conductive feature layout pattern extending in the first direction;
placing a second conductive feature layout pattern on the second layout level, the second conductive feature layout pattern corresponding to fabricating a second conductive structure of the integrated circuit, the second conductive feature layout pattern extending in the first direction, and being separated from the first conductive feature layout pattern in the second direction;

placing a first via layout pattern between the first conductive feature layout pattern and the first gate layout pattern of the set of gate layout patterns, the first via layout pattern corresponding to fabricating a first via, the first via coupling the first conductive structure to the first gate of the set of gate structures, and the first via layout pattern being located where the first conductive feature layout pattern overlaps the first gate layout pattern of the set of gate layout patterns; and placing a second via layout pattern between the second conductive feature layout pattern and the first metal over diffusion layout pattern, the second via layout pattern corresponding to fabricating a second via, the second via coupling the second conductive structure to the first metal over diffusion region, and the second via layout pattern being located where the second conductive feature layout pattern overlaps the first metal over diffusion layout patterns;

manufacturing the integrated circuit based on the layout design, the integrated circuit having the first gate of the set of gate structures; and removing a portion of the first gate of the set of gate structures to form a first gate structure and a second gate structure, and the cut feature layout pattern identifying a location of the removed portion of the first gate of the set of gate structures.

17. The method of claim 16, wherein the first conductive structure, the second conductive structure and the set of gate structures are coupled to each other as part of a cross-coupled structure.

18. The method of claim 16, wherein the set of design rules of the layout design comprise:

a set of distances between the first via layout pattern and the second via layout pattern;

a set of distances between the first metal over diffusion layout pattern and the first via layout pattern;

the set of distances between the first metal over diffusion layout pattern and a set of active region layout patterns; or a set of distances between the first metal over diffusion layout pattern and the cut feature layout pattern.

19. The method of claim 16, wherein the set of design rules of the layout design comprise:

the second via layout pattern being separated in the second direction from the cut feature layout pattern by more than a first via pitch between adjacent via layout patterns.

20. The method of claim 16, wherein generating the layout design of the integrated circuit further comprises:

placing a set of active region layout patterns extending in the first direction, being below the set of gate layout patterns and the first metal over diffusion layout pattern, and being separated from one another in the first direction or the second direction, the set of active region layout patterns corresponding to fabricating a set of active regions of the integrated circuit.

* * * * *